United States Patent
Kimura et al.

(10) Patent No.: US 10,210,813 B2
(45) Date of Patent: Feb. 19, 2019

(54) DISPLAY DEVICE, ELECTRONIC DEVICE, AND DRIVING METHOD OF DISPLAY DEVICE

(71) Applicant: Sony Corporation, Tokyo (JP)

(72) Inventors: Kei Kimura, Kanagawa (JP); Yusuke Onoyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/457,689

(22) Filed: Mar. 13, 2017

(65) Prior Publication Data

US 2017/0243544 A1 Aug. 24, 2017

Related U.S. Application Data

(63) Continuation of application No. 14/508,749, filed on Oct. 7, 2014, now Pat. No. 9,626,904.

(30) Foreign Application Priority Data

Nov. 15, 2013 (JP) .................................. 2013-236795

(51) Int. Cl.
*G09G 3/30* (2006.01)
*H01L 27/32* (2006.01)
(Continued)

(52) U.S. Cl.
CPC .............. *G09G 3/3266* (2013.01); *G09G 3/30* (2013.01); *G09G 3/3208* (2013.01);
(Continued)

(58) Field of Classification Search
CPC .............. H01L 27/3276; H01L 27/1255; H01L 27/1251; H01L 27/3265; H01L 27/3262;
(Continued)

(56) References Cited

U.S. PATENT DOCUMENTS 6,522,079 B1 * 2/2003 Yamada .............. H01L 27/3276
313/500
6,618,029 B1 * 9/2003 Ozawa ..................... G09G 3/30
257/40
(Continued)

FOREIGN PATENT DOCUMENTS

JP 2005-202255 A 7/2005
JP 2006-308768 A 11/2006
(Continued)

OTHER PUBLICATIONS

Japanese Office Action dated May 8, 2018 for corresponding Japanese Application No. 2017-121819.

*Primary Examiner* — Dismery Mercedes
(74) *Attorney, Agent, or Firm* — Michael Best & Friedrich LLP

(57) ABSTRACT

Provided is a display device including a driving transistor, a switching unit, and a control unit. The driving transistor includes a control terminal, a first terminal, and a second terminal, and controls supply of current to a light emitting element, which is connected to the first terminal and emits light in accordance with the current amount, in accordance with a signal voltage applied to the control terminal. The switching unit can switch a conduction and non-conduction state, and, by being brought in the conduction state, forms a path that bypasses the light emitting element so that the current is not supplied to the light emitting element. The control unit performs control so that the switching unit is brought in the non-conduction state after the signal voltage is written into the control terminal, and controls a potential of the control terminal in synchronization with the control of the switching unit.

19 Claims, 19 Drawing Sheets

(51) Int. Cl.
*H01L 27/12* (2006.01)
*G09G 3/3233* (2016.01)
*G09G 3/3266* (2016.01)
*G09G 3/3283* (2016.01)
*G09G 3/3291* (2016.01)
*G09G 3/3208* (2016.01)
*G09G 3/3258* (2016.01)

(52) U.S. Cl.
CPC ......... *G09G 3/3233* (2013.01); *G09G 3/3258* (2013.01); *G09G 3/3283* (2013.01); *G09G 3/3291* (2013.01); *H01L 27/124* (2013.01); *H01L 27/32* (2013.01); *H01L 27/3211* (2013.01); *H01L 27/3216* (2013.01); *H01L 27/3248* (2013.01); *H01L 27/3265* (2013.01); *H01L 27/3276* (2013.01); *H01L 27/3288* (2013.01); *G09G 2300/0426* (2013.01); *G09G 2300/0819* (2013.01); *G09G 2300/0852* (2013.01); *G09G 2300/0861* (2013.01); *G09G 2310/08* (2013.01); *G09G 2320/0219* (2013.01); *G09G 2320/0233* (2013.01); *G09G 2320/0238* (2013.01); *G09G 2320/045* (2013.01); *H01L 27/1255* (2013.01)

(58) Field of Classification Search
CPC ... H01L 27/3244; H01L 27/32; H01L 27/124; H01L 27/127; H01L 27/3225; H01L 27/3216; H01L 27/3218; H01L 27/3288; H01L 51/5296; H01L 51/50; G09G 3/3233; G09G 3/3208; G09G 3/3266; G09G 3/3258; G09G 2300/0842; G09G 2300/0426; G09G 2300/0809; G09G 2300/0439; G02F 1/13338; G02F 1/134336; G02F 1/136286; G02F 2201/123; G06F 3/044; G06F 3/047; G06F 3/0412; G06F 2203/04103
See application file for complete search history.

(56) References Cited

U.S. PATENT DOCUMENTS

| | | | |
|---|---|---|---|
| 7,154,454 B2 | 12/2006 | Okabe | |
| 7,358,938 B2* | 4/2008 | Kim | G09G 3/3233 345/77 |
| 7,760,165 B2 | 7/2010 | Cok | |
| 7,825,879 B2* | 11/2010 | Yamashita | G09G 3/3233 315/169.1 |
| 7,880,695 B2* | 2/2011 | Yamashita | G09G 3/3233 345/76 |
| 8,138,999 B2* | 3/2012 | Yamamoto | G09G 3/3233 315/169.3 |
| 8,237,631 B2* | 8/2012 | Tanikanne | G09G 3/3233 345/76 |
| 8,446,092 B2* | 5/2013 | Tomida | G09G 3/3233 313/506 |
| 8,466,910 B2 | 6/2013 | Shirasaki | |
| 8,587,203 B2 | 11/2013 | Chen | |
| 8,730,136 B2* | 5/2014 | Taneda | G09G 3/3233 345/76 |
| 8,754,882 B2* | 6/2014 | Maekawa | G09G 3/3233 315/169.1 |
| 8,760,374 B2* | 6/2014 | Osame | G09G 3/3241 345/82 |
| 8,791,888 B2 | 7/2014 | Uchino | |
| 8,921,865 B2* | 12/2014 | Asano | G09G 3/3233 257/72 |
| 8,987,719 B2* | 3/2015 | Moon | H01L 51/5296 257/392 |
| 9,064,452 B2* | 6/2015 | Kim | G09G 3/3208 |
| 9,070,324 B2 | 6/2015 | Kusafuka | |
| 9,123,294 B2* | 9/2015 | Han | G09G 3/3233 |
| 9,129,553 B2* | 9/2015 | Yamashita | G09G 3/3233 |
| 9,136,285 B2* | 9/2015 | Iida | G09G 3/3233 |
| 9,214,110 B2* | 12/2015 | Toyomura | G09G 3/3266 |
| 9,324,264 B2 | 4/2016 | Jeong | |
| 9,373,278 B2* | 6/2016 | Tanikame | G09G 3/3266 |
| 9,570,048 B2* | 2/2017 | Yumoto | G09G 3/3233 |
| 9,761,637 B2* | 9/2017 | Sagawa | H01L 27/3258 |
| 9,792,860 B2* | 10/2017 | Hokazono | G09G 3/3291 |
| 9,871,094 B2* | 1/2018 | Kim | H01L 28/60 |
| 2003/0112205 A1 | 6/2003 | Yamada | |
| 2005/0077844 A1* | 4/2005 | Koo | H01L 27/12 315/366 |
| 2005/0259093 A1 | 11/2005 | Osame | |
| 2006/0022305 A1 | 2/2006 | Yamashita | |
| 2006/0022907 A1 | 2/2006 | Uchino | |
| 2006/0208979 A1 | 9/2006 | Fish | |
| 2008/0074356 A1 | 3/2008 | Cok | |
| 2008/0074363 A1* | 3/2008 | Yamashita | G09G 3/3233 345/80 |
| 2008/0198104 A1* | 8/2008 | Yamashita | G09G 3/3233 345/77 |
| 2008/0231576 A1* | 9/2008 | Yamamoto | G09G 3/3233 345/90 |
| 2010/0118017 A1 | 5/2010 | Yamashita | |
| 2011/0068702 A1 | 3/2011 | van de Ven | |
| 2012/0001893 A1 | 1/2012 | Jeong et al. | |
| 2013/0043802 A1 | 2/2013 | Han | |
| 2013/0093801 A1* | 4/2013 | Asano | G09G 3/3233 345/690 |
| 2013/0201172 A1 | 8/2013 | Jeong | |
| 2014/0034923 A1* | 2/2014 | Kim | H01L 27/3297 257/40 |
| 2014/0340377 A1 | 11/2014 | Kishi | |
| 2015/0035735 A1 | 2/2015 | Kang | |
| 2015/0049126 A1 | 2/2015 | Jung | |

FOREIGN PATENT DOCUMENTS

| | | |
|---|---|---|
| JP | 2008-287141 | 11/2008 |
| JP | 2009-294508 A | 12/2009 |
| JP | 2013-161084 A | 8/2013 |

\* cited by examiner

FIG. 17
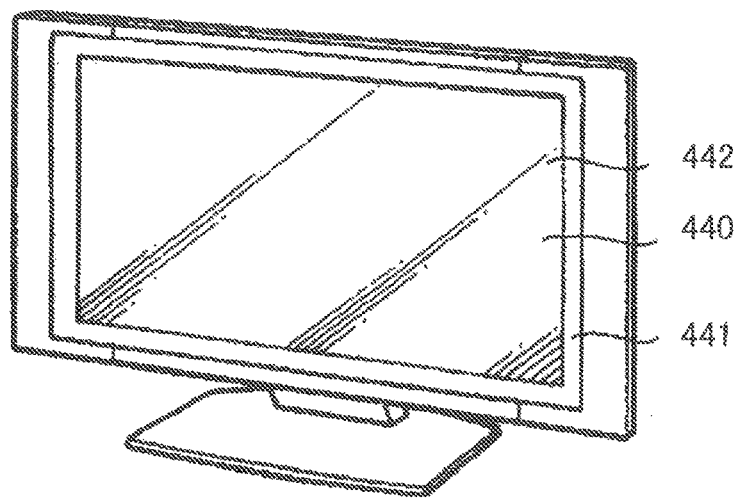
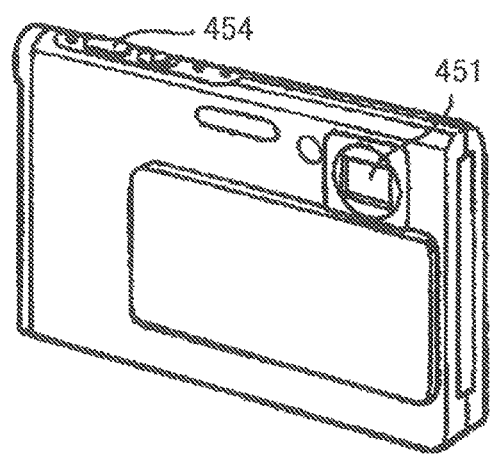
Fig. 18(A)
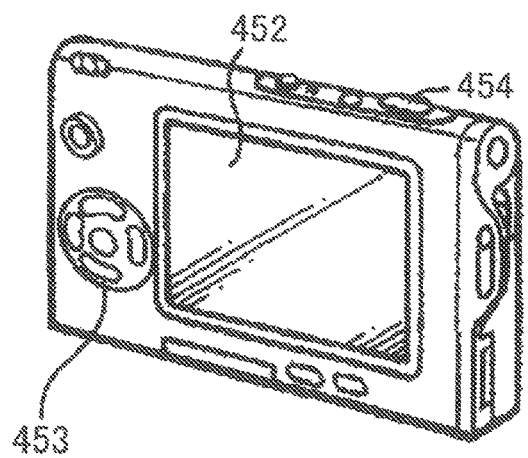
Fig. 18(B)

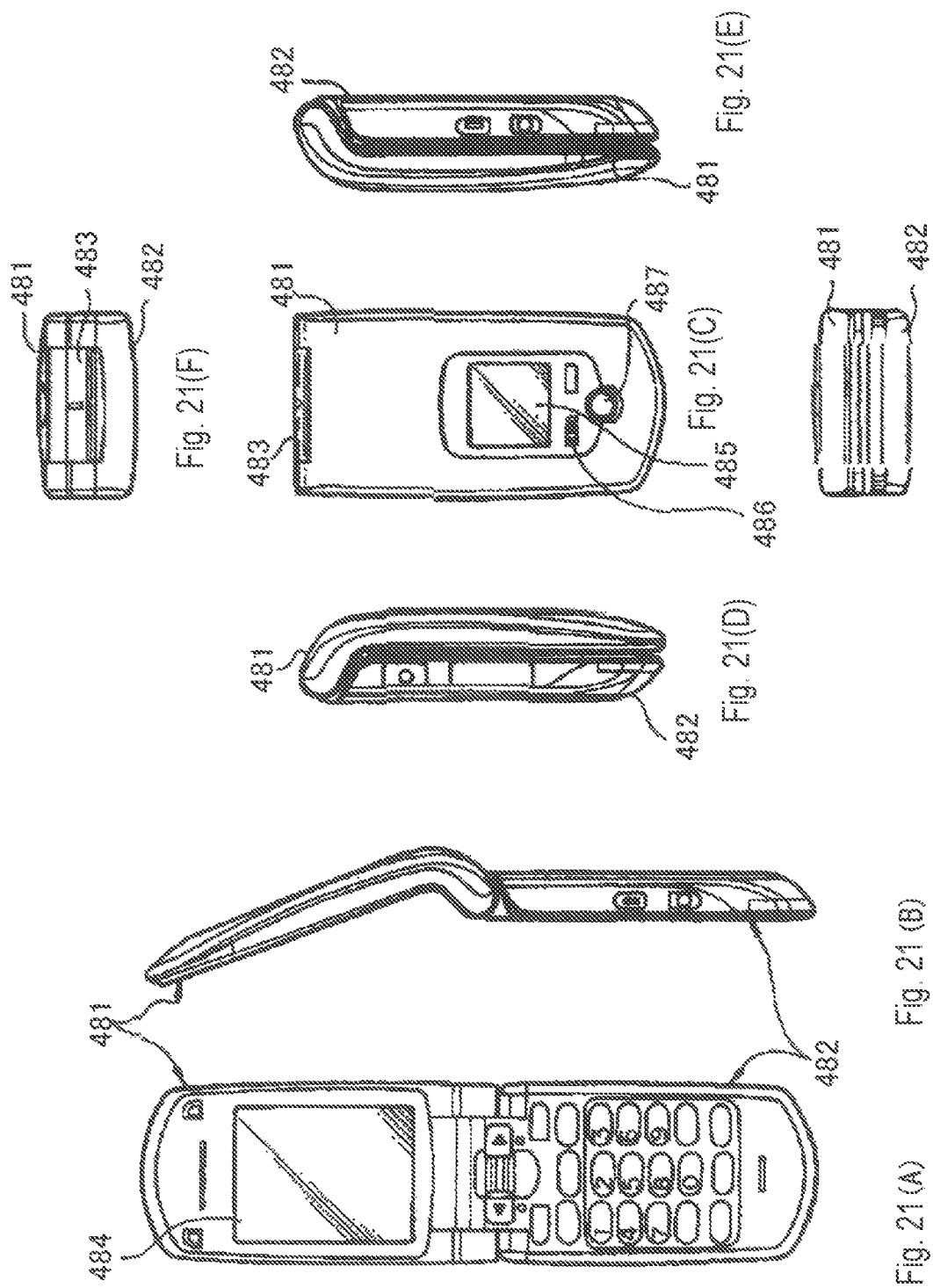

DISPLAY DEVICE, ELECTRONIC DEVICE, AND DRIVING METHOD OF DISPLAY DEVICE

CROSS REFERENCE TO RELATED APPLICATIONS

The present application is a Continuation of U.S. patent application Ser. No. 14/508,749, filed Oct. 7, 2014, which claims the benefit of Japanese Priority Patent Application JP 2013-236795 filed Nov. 15, 2013, the entire contents of which are incorporated herein by reference.

BACKGROUND

The present disclosure relates to a display device, an electronic device, and a driving method of the display device.

In recent years, in the field of display devices, planar type (flat panel type) display devices including pixels including light emitting units arranged in matrix have become a main stream. As one of the planar type display devices, there is a display device using a current-drive type electro-optical device in which the luminance changes in accordance with a current value supplied to the light emitting units, such as a display device using an organic electroluminescence element (hereinafter referred to as "organic EL element").

In order to supply current to the above described organic EL element, transistors are often used. Note that a transistor used for supply of current to the organic EL element may also be referred to as "driving transistor" hereinafter. For example, in a case in which black gradation is displayed by use of such an organic EL element, the driving transistor is turned off and the supply of current to the organic EL element is stopped, and accordingly the light emission of the organic EL element is suppressed, so that the black gradation is displayed. Note that as the driving transistor, a field-effect transistor is used, for example. For example, JP 2008-287141A discloses an example of a display device in which a transistor is used to supply current to the organic EL element.

SUMMARY

Meanwhile, in a case in which the driving transistor is turned off, in some cases, leak current may flow between a source and a drain of the driving transistor, and a contrast at the time of black gradation display may be decreased.

Accordingly, the present disclosure proposes a novel and improved display device, electronic device, and driving method of the display device by which the contrast at the time of black gradation display can be increased.

According to an embodiment of the present disclosure, there is provided a display device including a driving transistor including a control terminal, a first terminal, and a second terminal, the driving transistor being configured to control supply of current to a light emitting element in accordance with a signal voltage applied to the control terminal, the light emitting element being connected to the first terminal and configured to emit light in accordance with an amount of the current, a switching unit configured to be capable of switching a conduction state and a non-conduction state, the switching unit being configured to, by being brought in the conduction state, form a path that bypasses the light emitting element in a manner that the current is not supplied to the light emitting element, and a control unit configured to perform control in a manner that the switching unit is brought in the non-conduction state from the conduction state after the signal voltage is written into the control terminal, the control unit being configured to control a potential of the control terminal in synchronization with the control of the switching unit.

According to another embodiment of the present disclosure, there is provided an electronic device including a driving transistor including a control terminal, a first terminal, and a second terminal, the driving transistor being configured to control supply of current to a light emitting element in accordance with a signal voltage applied to the control terminal, the light emitting element being connected to the first terminal and configured to emit light in accordance with an amount of the current, a switching unit configured to be capable of switching a conduction state and a non-conduction state, the switching unit being configured to, by being brought in the conduction state, form a path that bypasses the light emitting element in a manner that the current is not supplied to the light emitting element, and a control unit configured to perform control in a manner that the switching unit is brought in the non-conduction state from the conduction state after the signal voltage is written into the control terminal, the control unit being configured to control a potential of the control terminal in synchronization with the control of the switching unit.

According to another embodiment of the present disclosure, there is provided a driving method of the display device, the driving method including controlling, by a driving transistor including a control terminal, a first terminal, and a second terminal, supply of current to a light emitting element in accordance with a signal voltage applied to the control terminal, the light emitting element being connected to the first terminal and configured to emit light in accordance with an amount of the current, forming a path that bypasses the light emitting element in a manner that the current is not supplied to the light emitting element by controlling the switching unit in a manner that the switching unit is brought into a conduction state, the switching unit being configured to be capable of switching the conduction state and a non-conduction state, and controlling, by a processor, the switching unit in a manner that the switching unit is brought into the non-conduction state from the conduction state after the signal voltage is written into the control terminal, and controlling a potential of the control terminal in synchronization with the control of the switching unit.

As described above, according to one or more embodiments of the present disclosure, there is provided a display device, an electronic device, and a driving method of the display device by which the contrast at the time of black gradation display can be increased.

The effects described in the specification are just explanatory or exemplary effects, and are not limiting. That is, the technology according to the present disclosure can exhibit other effects that are apparent to a person skilled in the art from the descriptions in the specification, along with the above effects or instead of the above effects.

BRIEF DESCRIPTION OF THE DRAWINGS

FIG. 17 is a perspective view showing the appearance of an application example 4 (a television device) of a display device according to an embodiment;

FIGS. 18A and 18B are perspective views showing the appearance of an application example 5 (a digital still camera) of a display device according to an embodiment;

FIGS. 21A to 21F are plan views showing a configuration of an application example 8 (a cell phone device) of a display device according to an embodiment.

DETAILED DESCRIPTION OF THE EMBODIMENT(S)

Figure 1:
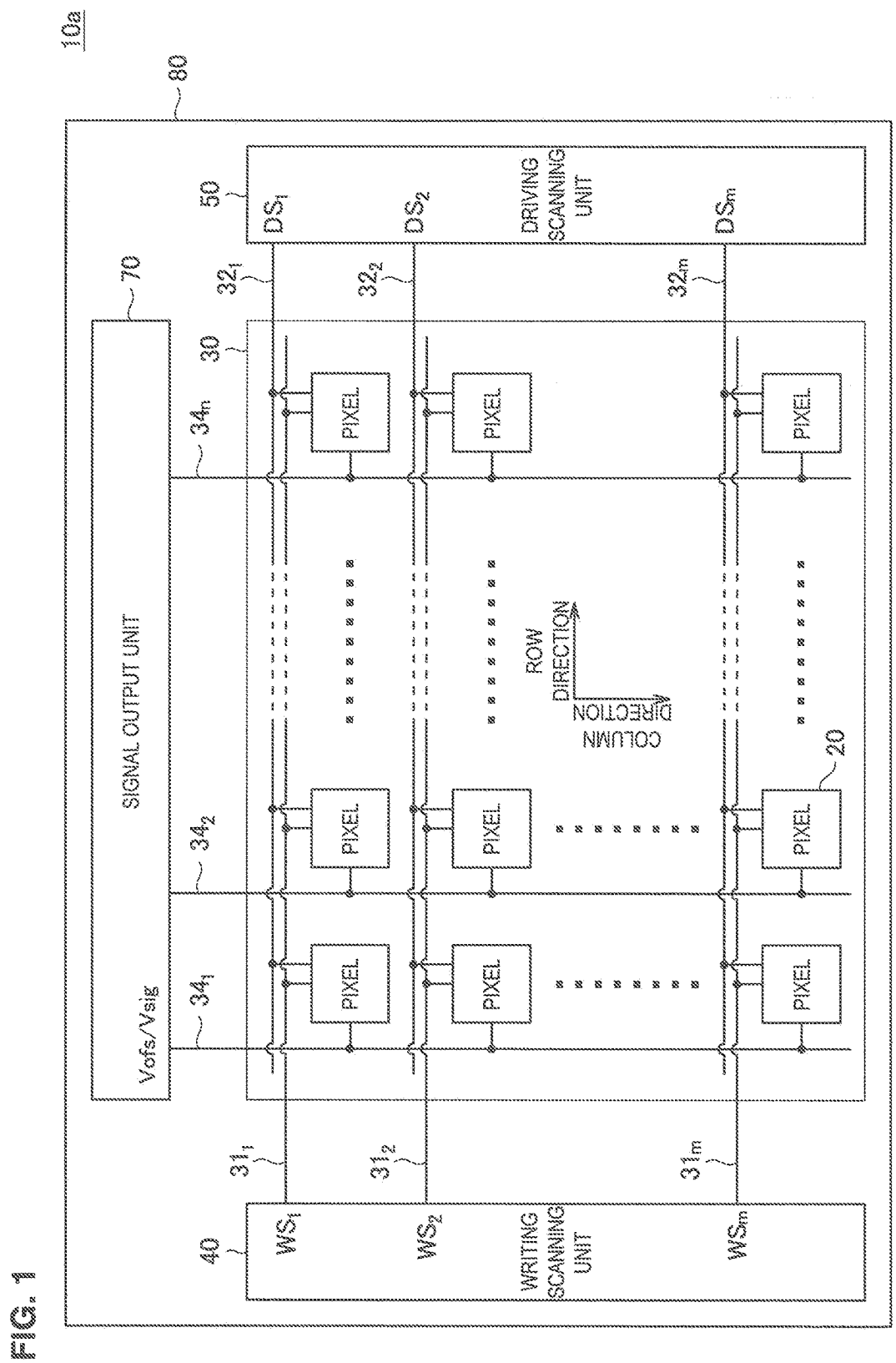
FIG. 1 is a system configuration diagram showing a general configuration of a display device according to a comparative example 1.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that the description will be made in the following order.
1. Display device according to embodiment
 1.1. Overview
 1.2. System configuration
 1.3. Circuit configuration of pixel circuit according to comparative example
 1.4. Driving method of pixel circuit according to comparative example
 1.5. Improvement points of pixel circuit according to comparative example
 1.6. Pixel circuit according to this embodiment
 1.7. Driving method of pixel circuit according to this embodiment
 1.8. Conclusion
2. Examples of display device and pixel circuit
 2.1. Example 1
 2.2. Example 2
 2.3. Example 3
 2.4. Example 4
3. Electronic device
4. Module and application examples
 4.0. Module
 4.1. Application example 1: lens interchangeable single-lens reflex type digital camera
 4.2. Application example 2: head-mounted display
 4.3. Application example 3: smartphone
 4.4. Application example 4: television device
 4.5. Application example 5: digital camera
 4.6. Application example 6: personal computer
 4.7. Application example 7: video camera
 4.8. Application example 8: cell phone device 1. Display Device According to Embodiment

[1.1. Overview]

A display device according to an embodiment of the present disclosure is a display device including a pixel circuit including a driving transistor that drives a light emitting unit, and is a so-called organic EL display device in which an organic EL element is used as a light emitting element (electro-optical device) of a pixel.

An organic EL display device in which an organic EL element is used as a light emitting unit of a pixel has the following characteristics. That is, the organic EL display device consumes low power because the organic EL element can be driven with an application voltage of 10 V or lower. Further, since the organic EL element is a self-luminescent element, the organic EL display device has a higher visibility of an image than a liquid crystal display device, which is a display device having a planar surface as well as the organic EL display device. Further, the organic EL display device can be made light and thin easily because a lighting member such as a back light is unnecessary. Furthermore, since the response speed of the organic EL element is very fast, which is approximately several micro seconds, the organic EL display device does not generate an afterimage when displaying a moving image.

The organic EL element is a self-luminescent element and also a current-drive type electro-optical device. Examples of the current-drive type electro-optical device include, in addition to the organic EL element, an inorganic EL element, an LED element, a semiconductor laser element, and the like.

A planar type display device such as an organic EL display device may be used as a display unit (display device) in various electronic devices including a display unit. Examples of the various electronic devices include a television system, a head mounted display, a digital camera, a video camera, an electronic view finder (EVF), a game machine, a laptop personal computer, a mobile information device such as an e-book reader, a mobile communication device such as a personal digital assistant (PDA) or a cell phone, and the like.

[1.2. System Configuration]

Next, a general system configuration of a display device according to an embodiment of the present disclosure will be described with reference to FIG. 1 and FIG. 2 in comparison with a system configuration of a common display device as a comparative example 1, focusing on differences from the comparative example 1. First, a general system configuration of a display device according to the comparative example 1 will be described with reference to FIG. 1. FIG. 1 is a system configuration diagram showing the general configuration of the display device according to the comparative example 1.

As shown in FIG. 1, the display device according to the comparative example 1 is a display device that controls current flowing into an electro-optical device by use of an active element provided in the same pixel circuit as the electro-optical device, such as an insulated gate field effect transistor. Examples of the insulated gate field effect transistor include a thin film transistor (TFT). Further, for example, an on-chip insulated gate field effect transistor may be formed over a base (silicon process) in the same manner as a micro organic light-emitting diode (Micro OLED).

Here, the description is made by taking, as an example, a case of an active matrix organic EL display device in which an organic EL element, for example, which is a current-drive type electro-optical device in which the luminance changes in accordance with a current value flowing in the device, is used as a light emitting unit (light emitting element) in a pixel circuit. Note that, hereinafter, the "active matrix organic EL display device" may also be simply referred to as "display device." Further, the "pixel circuit" may also be simply referred to as "pixel."

For example, a display device 10a according to the comparative example 1 includes a pixel array unit 30 in which a plurality of pixels 20 each including an organic EL element are arranged two-dimensionally in matrix and a driver circuit unit (driver unit) disposed on the periphery of the pixel array unit 30. The driver circuit unit includes a writing scanning unit 40, a driving scanning unit 50, and a signal output unit 70, which are equipped over a same display panel 80 as the pixel array unit 30, and drives each of the pixels 20 of the pixel array unit 30, for example.

In a case in which the display device 10a is capable of color display, one pixel (unit pixel) serving as a unit of forming a color image includes a plurality of sub-pixels. In this case, each of the sub-pixels corresponds to each of the pixels 20 in FIG. 1. More specifically, in a display device capable of color display, for example, one pixel includes three sub-pixels: a sub-pixel that emits red (R) light, a sub-pixel that emits green (G) light, and a sub-pixel that emits blue (B) light.

However, the combination of sub-pixels in one pixel is not limited to three primary colors of RGB, but one pixel may include a sub-pixel of one more color or sub-pixels of plural colors in addition to the sub-pixels of three primary colors. More specifically, for example, one pixel may include a sub-pixel that emits white (W) light in order to increase the luminance, or may include at least one sub-pixel that emits light of a complementary color in order to enlarge the range of color reproduction.

In the pixel array unit 30, for the arrangement of pixels 20 having m rows and n columns, scanning lines 31 ($31_1$ to $31_m$) are arranged along a row direction (direction of the arrangement of pixels in a pixel row/horizontal direction), and driving lines 32 ($32_1$ to $32_m$) are arranged for each pixel row. Further, for the arrangement of pixels 20 having m rows and n columns, signal lines 34 ($34_1$ to $34_n$) are arranged for each pixel column along a column direction (direction of the arrangement of pixels in a pixel column/vertical direction).

The scanning lines $31_1$ to $31_m$ are each connected to an output terminal of a corresponding row of the writing scanning unit 40. The driving lines $32_1$ to $32_m$ are each connected to an output terminal of a corresponding row of the driving scanning unit 50. The signal lines $34_1$ to $34_n$ are each connected to an output terminal of a corresponding column of the signal output unit 70.

The writing scanning unit 40 is formed by a shift register circuit, for example. The writing scanning unit 40 scans each of the pixels 20 of the pixel array unit 30 sequentially in a row unit (that is, the writing scanning unit 40 performs line sequential scanning) by supplying writing scanning signals WS ($WS_1$ to $WS_m$) sequentially to the scanning lines 31 ($31_1$ to $31_m$) when writing a signal voltage of an image signal to each of the pixels 20 of the pixel array unit 30.

The driving scanning unit 50 is formed by a shift register circuit, for example, similarly to the writing scanning unit 40. The driving scanning unit 50 controls light emission/non-light emission (quenching) of the pixels 20 by supplying light emission control signals DS ($DS_1$ to $DS_m$) to the driving lines 32 ($32_1$ to $32_m$) in synchronization with the line sequential scanning performed by the writing scanning unit 40.

The signal output unit 70 selectively outputs a signal voltage Vsig of an image signal (hereinafter also simply referred to as "signal voltage") in accordance with luminance information supplied from a signal supply source (not shown) and a reference voltage Vofs. Here, the reference voltage Vofs is a voltage that corresponds to a voltage serving as a reference of the signal voltage Vsig of the image signal (e.g., a voltage corresponding to a black level of the image signal) or a neighboring voltage, and is an initialization voltage used when a correction operation, which will be described later, is performed.

The signal voltage Vsig and the reference voltage Vofs outputted alternatively from the signal output unit 70 are written into each of the pixels 20 of the pixel array unit 30 through the signal lines 34 ($34_1$ to $34_n$), in a unit of a pixel row selected through the line sequential scanning performed by the writing scanning unit 40. That is, the signal output unit 70 employs a driving mode of line sequential writing in which the signal voltage Vsig is written in a pixel row (line) unit.

Next, a system configuration of a display device 10 according to an embodiment of the present disclosure will be described with reference to FIG. 2, focusing on parts different from those of the display device 10a according to the comparative example 1. FIG. 2 is a system configuration diagram showing a general configuration of the display device 10 according to this embodiment. Note that, in the example shown in FIG. 2, each of the pixels 20 includes, as an example, sub-pixels of RGBW, i.e., an R pixel 20r, a G pixel 20g, a B pixel 20b, and a W pixel 20w. Hereinafter, each of the R pixel 20r, the G pixel 20g, the B pixel 20b, and the W pixel 20w may also be simply referred to as "pixel 20", if not particularly distinguished.

Figure 2:
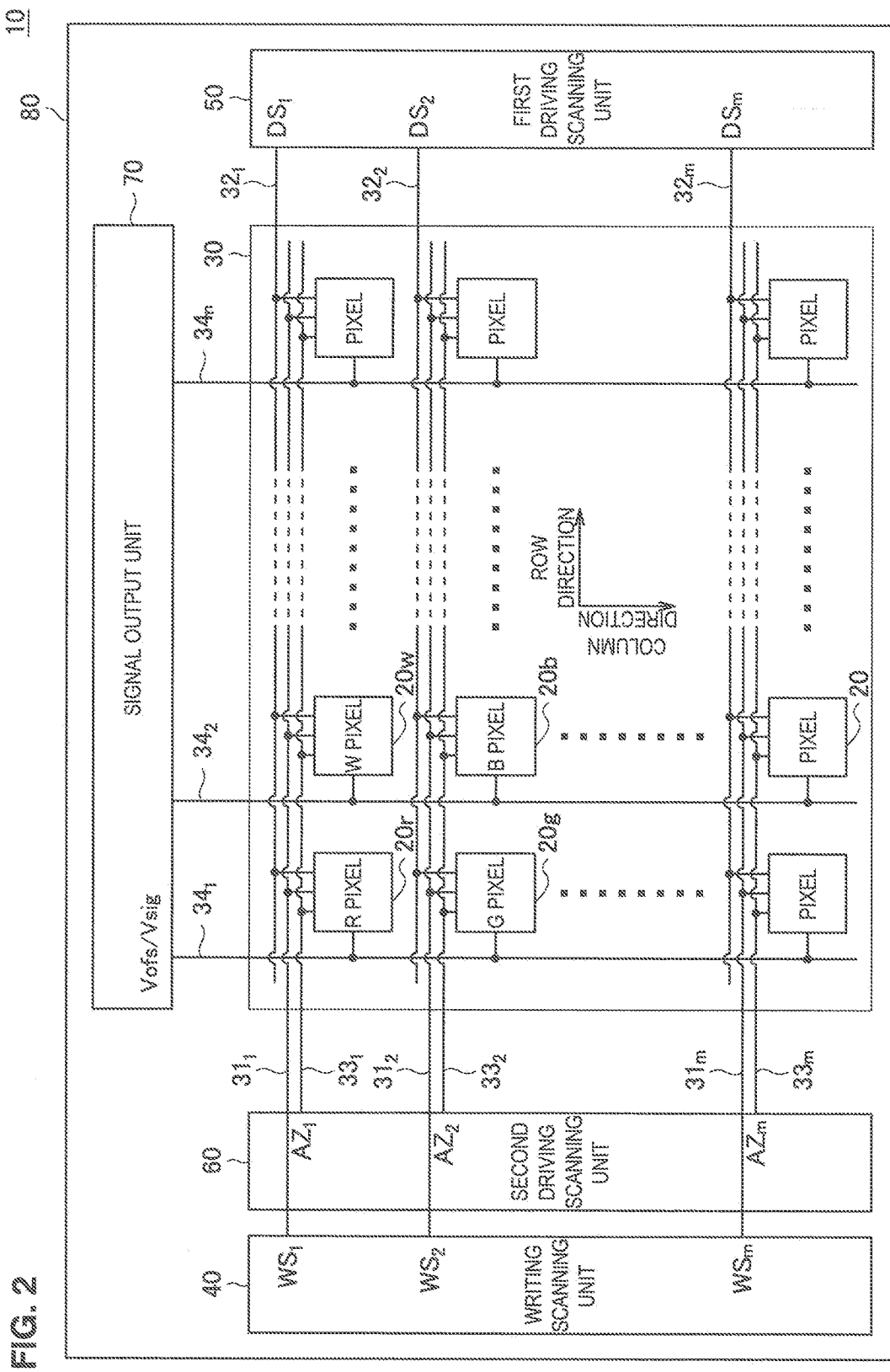
FIG. 2 is a system configuration diagram showing a general configuration of a display device according to an embodiment.

As shown in FIG. 2, the display device 10 according to this embodiment is different from the display device 10a according to the comparative example 1 mainly in that the driver circuit unit disposed on the periphery of the pixel array unit 30 has a different configuration. That is, the driver circuit unit according to this embodiment includes the writing scanning unit 40, a first driving scanning unit 50, a second driving scanning unit 60, and the signal output unit 70, which are equipped over the same display panel 80 as the pixel array unit 30, and drives each of the pixels 20 of the pixel array unit 30, for example. Note that, in a driver unit of the display device 10 according to this embodiment, the first driving scanning unit 50 corresponds to the driving scanning unit 50 in a driver unit of the display device 10a according to the comparative example 1. Note that, in the description of the driver unit of the display device 10 according to this embodiment, a configuration that corresponds to the driving lines 32 in the driver unit of the display device 10a according to the comparative example 1 is referred to as "first driving lines 32."

Further, the driver unit of the display device 10 according to this embodiment is different from the driver unit of the display device 10a according to the comparative example 1 in that the driver unit of the display device 10 according to this embodiment includes the second driving scanning unit 60 and that second driving lines 33 ($33_1$ to $33_m$) are arranged for each pixel row along the row direction. The second driving lines $33_1$ to $33_m$ are each connected to an output terminal of a corresponding row of the second driving scanning unit 60.

The second driving scanning unit 60 is formed by a shift register circuit, for example, similarly to the writing scanning unit 40. The second driving scanning unit 60 performs control such that pixels 20 do not emit light during a non-light-emission period by supplying driving signals AZ ($AZ_1$ to $AZ_m$) to the second driving lines 33 ($33_1$ to $33_m$) in synchronization with the line sequential scanning performed by the writing scanning unit 40.

Note that the example shown in FIG. 2 shows the system configuration in which the writing scanning unit 40, the first driving scanning unit 50, the second driving scanning unit 60, and the signal output unit 70 are provided over the display panel 80; however, the present disclosure is not limited to this configuration. For example, some of or all the writing scanning unit 40, the first driving scanning unit 50, the second driving scanning unit 60, and the signal output unit 70 may be provided outside the display panel 80.

[1.3. Circuit Configuration of Pixel Circuit According to Comparative Example]

Next, before description of pixels (pixel circuit) of the display device 10 according to this embodiment shown in FIG. 2, in order to consider improvement points of the display device 10 according to this embodiment, an example of a pixel circuit that can be used in a display device having the same system configuration will be described as a comparative example 2.

Figure 3:
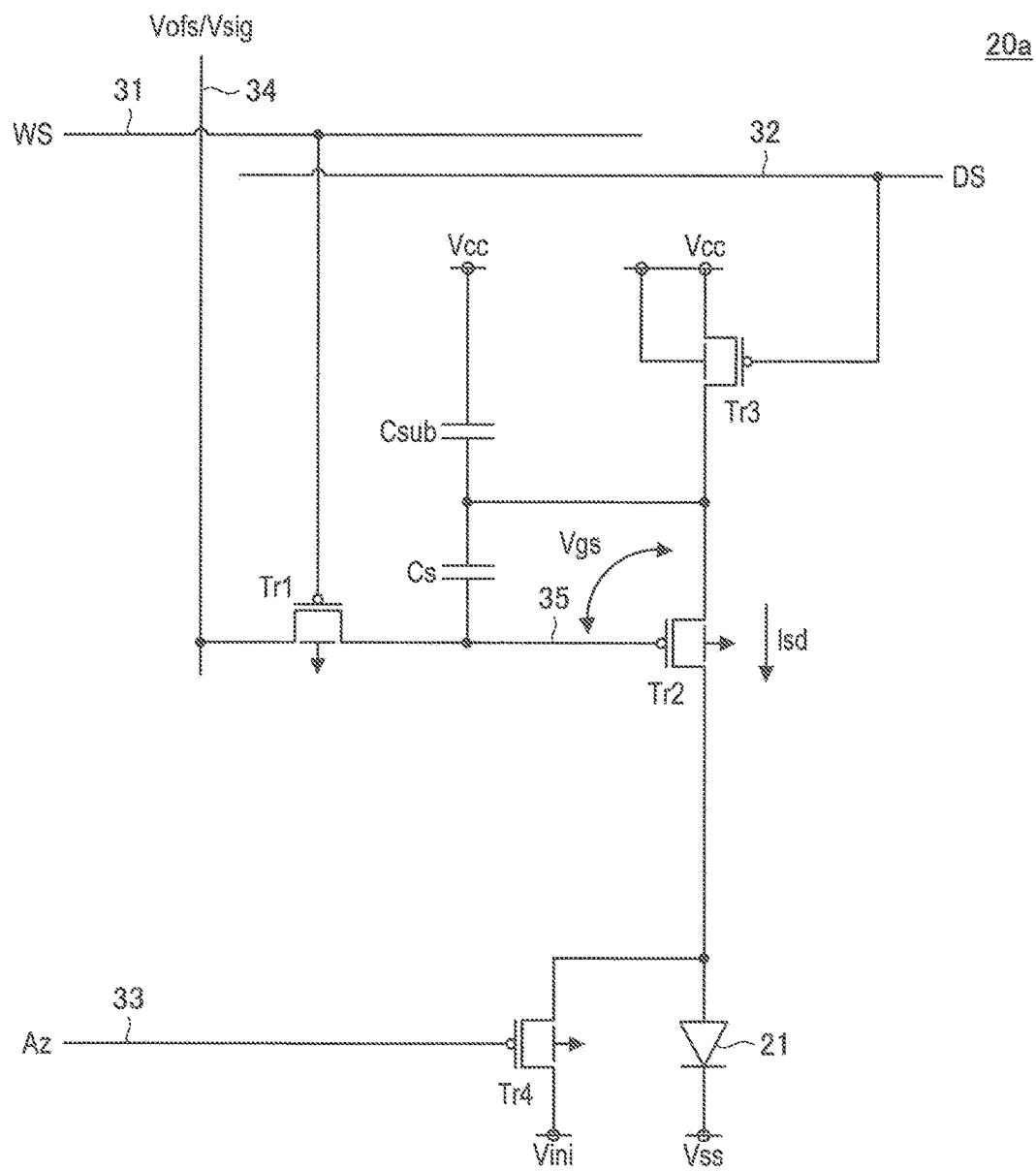
FIG. 3 is a circuit diagram showing an example of a pixel (pixel circuit) according to a comparative example 2.

First, a circuit configuration of a pixel circuit according to the comparative example 2 will be described with reference to FIG. 3. FIG. 3 is a circuit diagram showing an example of a pixel (pixel circuit) 20a according to the comparative example 2.

A light emitting unit of each of the pixels 20 includes an organic EL element 21. The organic EL element 21 is an example of a current-drive type electro-optical device in which the luminance changes in accordance with a current value flowing in the device.

As shown in FIG. 3, a pixel 20a includes the organic EL element 21 and a driver circuit that drives the organic EL element 21 by supplying current to the organic EL element 21. A cathode electrode of the organic EL element 21 is connected to a power source voltage Vss (a potential common to all the pixels 20)

The driver circuit that drives the organic EL element 21 includes a driving transistor Tr2, a sampling transistor Tr1, a light emission control transistor Tr3, a switching transistor Tr4, a storage capacitor Cs, and an auxiliary capacitor Csub. Note that the description is made on the assumption that the pixel (pixel circuit) 20a is formed over a semiconductor such as silicon, not over an insulator such as a glass substrate. Further, the driving transistor Tr2 is formed by a p-channel type transistor.

Furthermore, the description is made on the assumption that, similarly to the driving transistor Tr2, the sampling transistor Tr1, the light emission control transistor Tr3, and the switching transistor Tr4 are all formed by a p-channel transistor. Accordingly, each of the driving transistor Tr2, the sampling transistor Tr1, the light emission control transistor Tr3, and the switching transistor Tr4 does not have three terminals of a source, a gate, and a drain, but has four terminals of a source, a gate, a drain, and a back gate. A power source voltage Vcc is applied to the back gate of each transistor. Note that the gate node corresponds to an example of the "control terminal, and the drain node and the source node correspond to examples of the "first terminal" and the "second terminal."

In the pixel 20a having the above configuration, the sampling transistor Tr1 samples the signal voltage Vsig supplied from the signal output unit 70 through the signal lines 34, thereby writing the signal voltage Vsig to the gate node (gate electrode) of the driving transistor Tr2. Note that "to write" here means to apply the signal voltage to the gate node so that the potential of the gate node is retained at a potential based on the signal voltage.

The light emission control transistor Tr3 is connected between a power source node of the power source voltage Vcc and the source node (source electrode) of the driving transistor Tr2, and is driven by the light emission control signal DS to control the light emission/non-light-emission of the organic EL element 21.

The switching transistor Tr4 is connected between the drain node (drain electrode) of the driving transistor Tr2 and a current discharging node Vini, and is driven by the driving signal AZ to perform control such that the organic EL element 21 does not emit light during a non-light-emission period of the organic EL element 21. That is, the switching transistor Tr4 has a function of forming a bypass (that is, a function of bypassing) the organic EL element 21 such that current does not flow to the organic EL element 21 by being brought into a conduction state.

The storage capacitor Cs is connected between the gate node of the driving transistor Tr2 and the source node of the driving transistor Tr2, and retains the signal voltage Vsig written by sampling by the sampling transistor Tr1. The driving transistor Tr2 drives the organic EL element 21 by flowing the driver current, in accordance with the stored voltage of the storage capacitor Cs, to the organic EL element 21.

The auxiliary capacitor Csub is connected between the source node of the driving transistor Tr2 and a node at a fixed potential (e.g., the power source node of the power source voltage Vcc). The auxiliary capacitor Csub has a function of suppressing variation of the source voltage of the driving transistor Tr2 when the signal voltage Vsig is written and a function of setting a gate-source voltage Vgs of the driving transistor Tr2 at a threshold voltage Vth of the driving transistor Tr2.

[1.4. Driving Method of Pixel Circuit According to Comparative Example]

Next, an example of a driving method of the pixel (pixel circuit) 20a according to the comparative example 2 will be described. The driving method according to the comparative example 2 performs the following driving. First, in the state where the source node of the driving transistor Tr2 is in a non-floating state, the reference voltage Vofs which is an initialization voltage is written into the gate node of the driving transistor Tr2. After that, until the sampling transistor Tr1 writes the signal voltage Vsig, the gate node and the source node of the driving transistor Tr2 are kept in a floating state.

Figure 4:
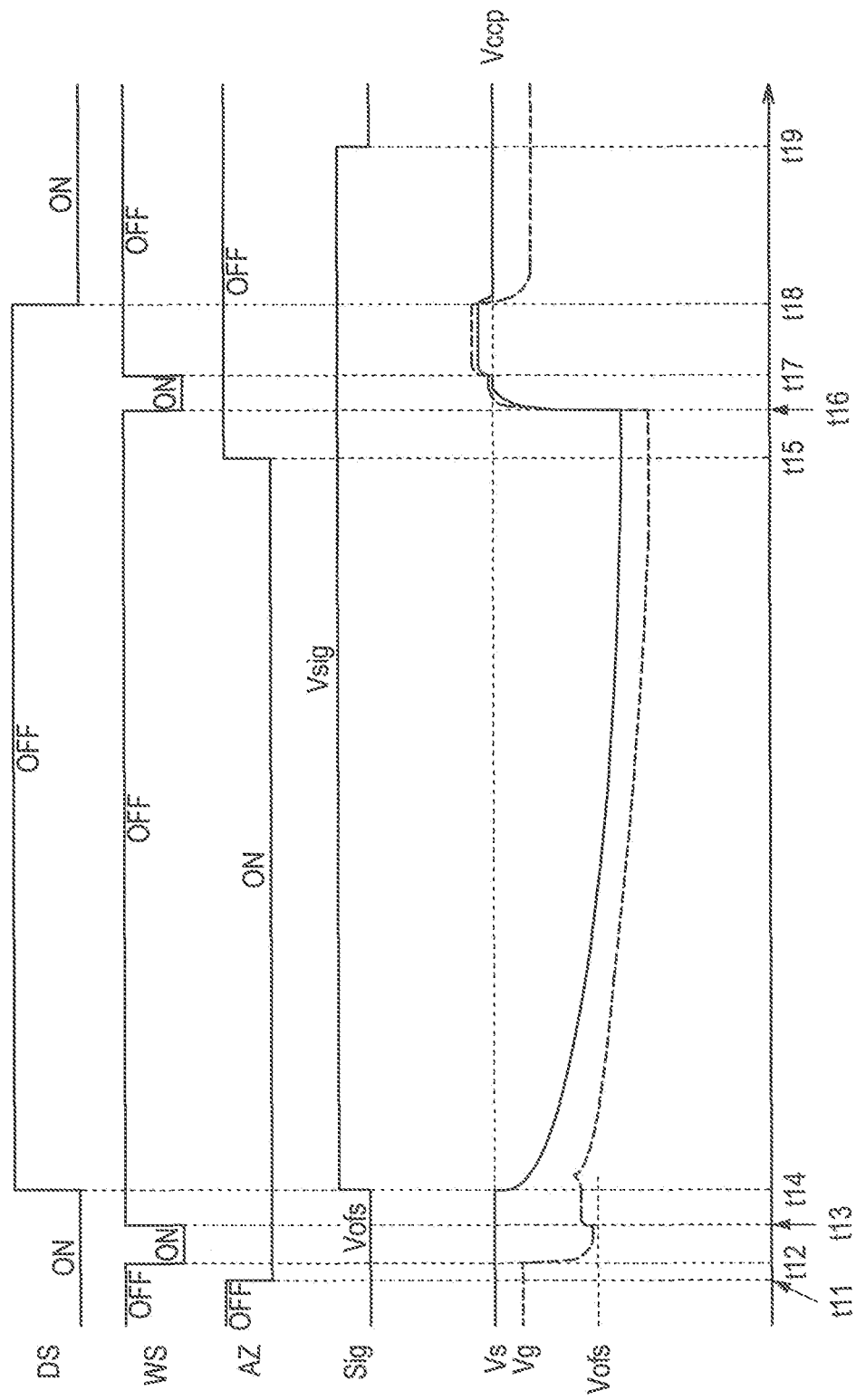
FIG. 4 is a timing waveform chart for describing a driving method according to the comparative example 2.

The driving method according to the comparative example 2 will be specifically described below with reference to a timing waveform chart in FIG. 4. FIG. 4 is a timing waveform chart for describing the driving method according to the comparative example 2. The timing waveform chart in FIG. 4 shows changes of each of the light emission control signal DS, the writing scanning signal WS, the driving signal AZ, the potential Vofs/Vsig of the signal line 34, a source voltage Vs of the driving transistor Tr2, and a gate voltage Vg of the driving transistor Tr2.

At a time t11 when the light emission control signal DS is in an active state (a low voltage state) and the writing scanning signal WS is in a non-active state (high voltage state), the driving signal AZ is brought into an active state. That is, the driving signal AZ is brought into an active state prior to a sampling timing (time t12) of an initialization voltage (i.e., the reference voltage Vofs) performed by the sampling transistor Tr1. Then, because the driving signal AZ is brought into an active state, the switching transistor Tr4 is brought into a conduction state. Accordingly, after that, current flowing into the driving transistor Tr2 also flows into the current discharging node Vini via the switching transistor Tr4.

Next, at the time t12, the writing scanning signal WS is brought into an active state, and in response, the sampling transistor Tr1 is brought into a conduction state. At this time, because the light emission control transistor Tr3 is in a conduction state, the power source voltage Vcc is applied to the source node of the driving transistor Tr2. That is, the source node of the driving transistor Tr2 is in a non-floating state. In this state, by sampling performed by the sampling transistor Tr1, the reference voltage Vofs is written into the gate node of the driving transistor Tr2. As described above, the reference voltage Vofs is supplied from the signal output unit 70 to the signal line 34 at a timing different from the timing of the signal voltage Vsig.

Then, at a time t13, the writing scanning signal WS is brought into a non-active state, whereby writing of the reference voltage Vofs ends. That is, prior to timing when the light emission control signal DS is brought into a non-active state (time t14), writing (sampling) of the reference voltage Vofs performed by the sampling transistor Tr1 is completed. Note that, although current Isd flows into the driving transistor Tr2 by writing of the reference voltage Vofs, the current Isd flown into the driving transistor Tr2 flows into the current discharging node Vini via the switching transistor Tr4 because the switching transistor Tr4 is in a conduction state, as described above. Accordingly, the organic EL element 21 does not emit light during a period in which the switching transistor Tr4 is in a conduction state, and thus, the contrast of the display panel 80 is not decreased.

Further, at the time t13, the writing scanning signal WS is brought into a non-active state and the sampling transistor Tr1 is brought into a non-conduction state, and therefore, the gate node of the driving transistor Tr2 is brought into a floating state. Next, at the time t14, the light emission control signal DS is brought into a non-active state and the light emission control transistor Tr3 is brought into a non-conduction state, and therefore, the source node of the driving transistor Tr2 is brought into a floating state. That is, after the reference voltage Vofs is written to the gate node of the driving transistor Tr2, the gate node of the driving transistor Tr2 and then the source node of the driving transistor Tr2 are sequentially brought into a floating state.

Then, the gate node of the driving transistor Tr2 and the source node of the driving transistor Tr2 are both brought into a floating state and self-discharge is performed. Discharge of a potential of each node in the self-discharge is performed through a path of the driving transistor Tr2, the switching transistor Tr4, and the current discharging node Vini. Further, by the self-discharge, both the source voltage Vs and the gate voltage Vg of the driving transistor Tr2 are gradually decreased. In the self-discharge, basically, the source voltage Vs and the gate voltage Vg of the driving transistor Tr2 are decreased with the gate-source voltage Vgs maintained.

When the self-discharge ends (that is, the change in the source voltage Vs and the gate voltage Vg due to the self-discharge converges), at a time t15, the driving signal AZ is brought into a non-active state, and in response, the switching transistor Tr4 is brought into a non-conduction state. Further, at a time t16, the writing scanning signal WS is brought into an active state, and in response, the sampling transistor Tr1 is brought into a non-conduction state. Thus, while the source node of the driving transistor Tr2 is in a floating state, the signal voltage Vsig=Vccp is written by sampling performed by the sampling transistor Tr1. Note that the potential Vccp is the potential of the power source voltage Vcc.

At a time t17, writing of the signal voltage Vsig is completed. Thus, the source voltage Vs of the driving transistor Tr2 is fixed at the power source voltage Vcc (in the non-floating state). At this time, the gate voltage Vg of the driving transistor Tr2 is increased by a bootstrap operation. After that, at a time t18, the light emission control signal DS is brought into an active state, and in response, the light emission control transistor Tr3 is brought into a conduction state.

[1.5. Improvement Points of Pixel Circuit According to Comparative Example]

Meanwhile, with the pixel circuit according to the comparative example 2 and the driving method of the same, at the time t18, when the light emission control signal DS is brought into an active state, in some cases, a potential difference may be generated between the gate and the source of the driving transistor Tr2 (that is, the gate-source voltage Vgs may be increased).

Specifically, when the light emission control signal DS is changed to be in an active state, capacitive coupling by parasitic capacitance between the gate node of the light emission control transistor Tr3 and the gate node of the driving transistor Tr2 may sometimes decrease the gate voltage Vg of the driving transistor Tr2. At this time, since the source voltage Vs is grounded at the power source voltage Vcc, only the gate voltage Vg of the driving transistor Tr2 is decreased, and a potential difference between the gate and the source of the driving transistor Tr2 is generated (that is, the gate-source voltage Vgs is increased). In particular, such a phenomenon is likely to occur significantly in a case in which a p-channel type transistor is used as the driving transistor Tr2, the p-channel transistor being configured to switch the state between the conduction state and the non-conduction state in accordance with the signal voltage to be applied to (retained at) the gate node, compared with a case in which an n-channel type transistor is used.

Under such circumstances, even in a case in which the gate-source voltage Vgs of the driving transistor Tr2 does not exceed the threshold voltage Vth of the driving transistor Tr2, it may be sometimes difficult to cut off the leakage current Isd between the source and the drain. Accordingly, also in a case in which black gradation is displayed, the leakage current Isd between the source and the drain may cause the organic EL element 21 to emit light (for example, gray light), which may result in a decrease in the contrast.

[1.6. Pixel Circuit According to this Embodiment]

Accordingly, the pixel circuit according to this embodiment and the driving method of the same has been made in order to suppress the decrease in the contrast (that is, to increase the contrast) even in a case in which black gradation is displayed. Specifically, according to the pixel circuit according to this embodiment and the driving method of the same, in a case in which the gate voltage Vg is decreased by capacitive coupling by parasitic capacitance (i.e., parasitic capacitance between the gate node of the light emission control transistor Tr3 and the gate node of the driving transistor Tr2), control is performed such that the gate voltage Vg becomes higher than the source voltage Vs. In accordance with such control, in the pixel circuit according to this embodiment and the driving method of the same, the leakage current Isd between the source and the drain is suppressed. Accordingly, in a case in which the pixel circuit according to the comparative example 2 and the driving method of the same are used, it becomes possible to suppress the decrease in the contrast due to the leakage current Isd. Therefore, in the following description, a circuit configuration of the pixel circuit according to this embodiment will be described and then the driving method of the pixel circuit will be described.

Figure 5:
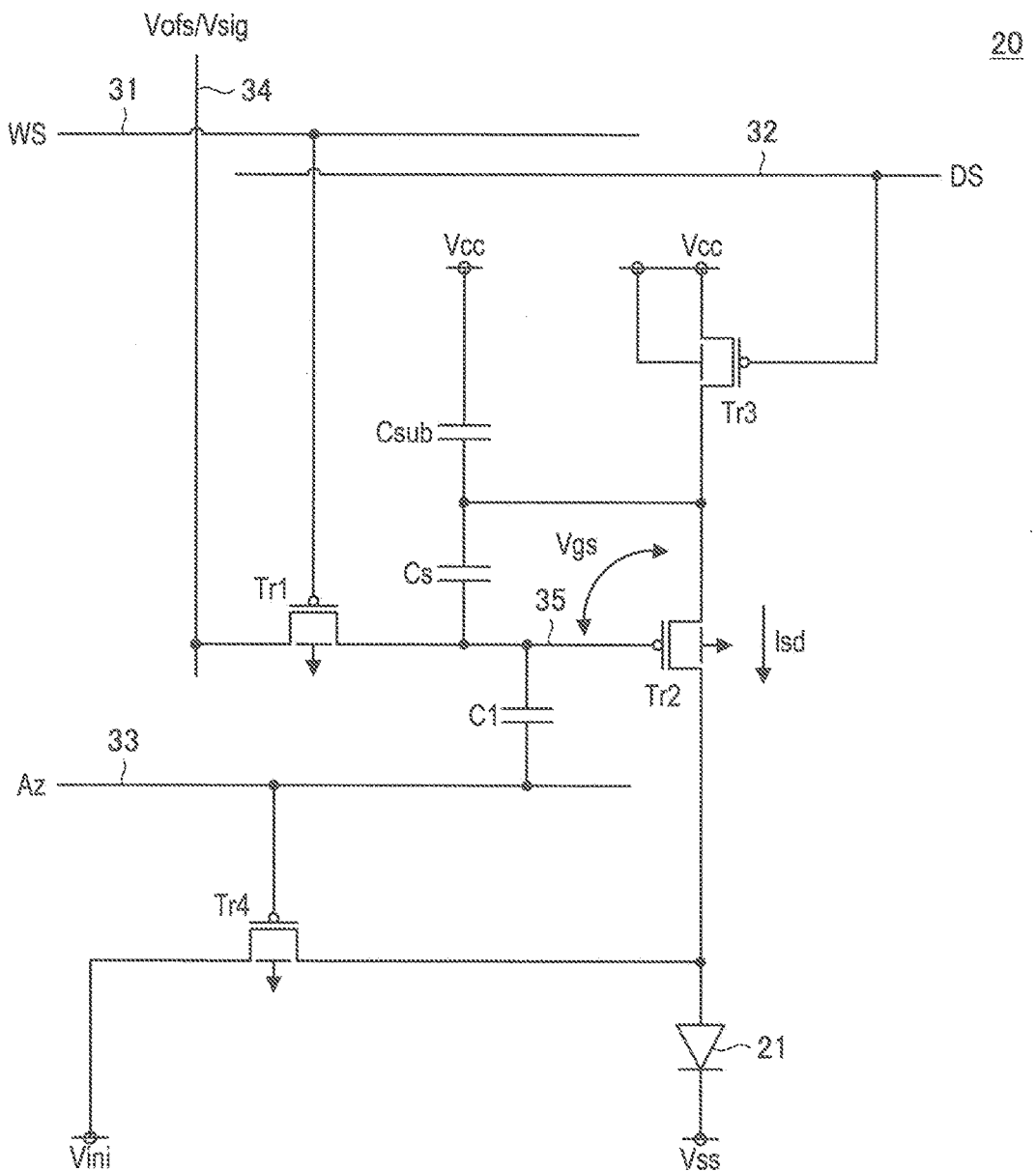
FIG. 5 is a circuit diagram showing an example of a pixel (pixel circuit) in a display device according to an embodiment.

First, a configuration of the pixel (pixel circuit) 20 according to this embodiment will be described with reference to FIG. 5, focusing on parts different from those of the pixel 20a (see FIG. 3) according to the comparative example 2. FIG. 5 is a circuit diagram showing an example of the pixel 20 in the display device 10 according to this embodiment.

As shown in FIG. 5, the pixel 20 according to this embodiment is different from the pixel 20a according to the comparative example 2 in that a capacitance C1 is formed between the signal line 33 that supplies the driving signal AZ to the witching transistor Tr4 and a signal line 35 that is connected to the gate node of the driving transistor Tr2.

The capacitance C1 may be parasitic capacitance formed by provision of the signal line 33 and the signal line 35 in parallel to each other, or may be formed by provision of a capacitor between the signal line 33 and the signal line 35. Note that the switching transistor Tr4 corresponds to an example of the "switching unit," the signal line 33 corresponds to an example of the "first signal line," and the signal line 35 corresponds to an example of the "second signal line."

As shown in FIG. 5, by providing the capacitance C1, in a case in which the driving signal AZ is changed from an active state to a non-active state, the capacitive coupling by the capacitance C1 enables the gate voltage Vg of the driving transistor Tr2 to be controlled. That is, in the pixels 20 according to this embodiment, the gate voltage Vg that has been decreased by the capacitive coupling by parasitic capacitance between the gate node of the light emission control transistor Tr3 and the gate node of the driving transistor Tr2 is controlled to be higher than the source voltage Vs by the capacitive coupling by the capacitance C1. It is needless to say that the control amount of the gate voltage Vg is decided on the basis of the electrostatic capacitance of the capacitance C1. In other words, the control amount of the gate electrode Vg is decided by adjustment of the electrostatic capacitance of the capacitance C1.

Owing to the above described configuration, in the circuit according to this embodiment, it is more desirable that the same type transistor be used as the driving transistor Tr2 and as the switching transistor Tr4 in order to simplify the circuit configuration of the pixel 20. That is, in a case in which a p-channel type transistor is used as the driving transistor Tr2, it is more desirable to use a p-channel type transistor also as the switching transistor Tr4.

[1.7. Driving Method of Pixel Circuit According to this Embodiment]

Figure 6:
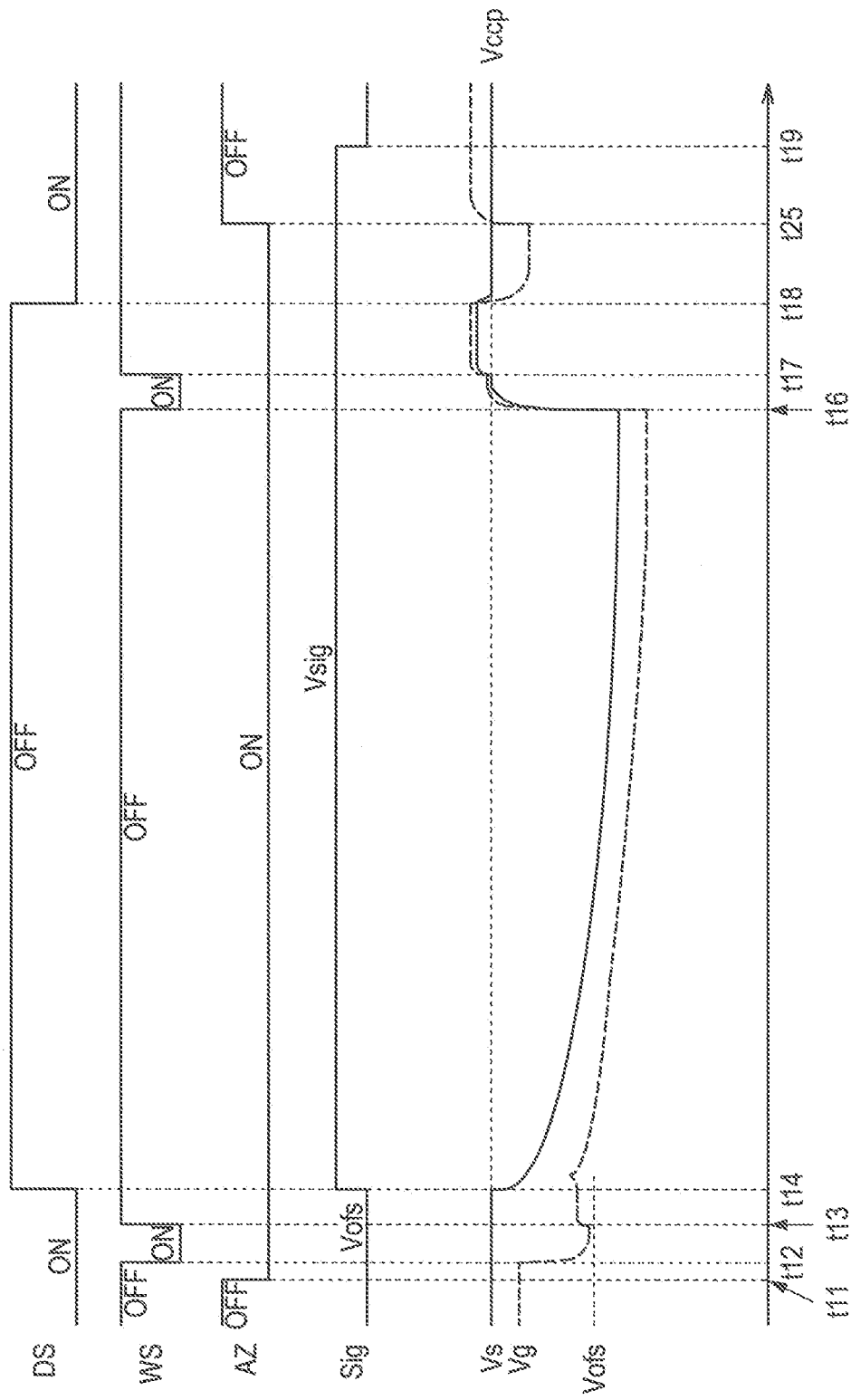
FIG. 6 is a timing waveform chart for describing a driving method according to an embodiment.

Next, an example of the driving method of the pixel 20 according to this embodiment will be specifically described with reference to a timing waveform chart shown in FIG. 6. FIG. 6 is a timing waveform chart for describing the driving method according to this embodiment. Note that the timing waveform diagram in FIG. 6 shows changes of each of the light emission control signal DS, the writing scanning signal WS, the driving signal AZ, the potential Vofs/Vsig of the signal line 34, and the source voltage Vs of the driving transistor Tr2 and the gate voltage of the driving transistor Tr2, as in FIG. 4. Further, operations at the times t11 to t14 are the same as those in the driving method according to the comparative example 2 shown in FIG. 4, and therefore, a detailed description thereof is omitted.

As shown in FIG. 6, in the driving method according to this embodiment, timing at which the driving signal AZ is changed from an active state to a non-active state is different from that in the driving method according to the comparative example 2 (see FIG. 4). Specifically, in the driving method according to this embodiment, sampling performed by the sampling transistor Tr1 (that is, switching by the sampling transistor Tr1 with the writing scanning signal WS) from the time t16 to the time t17 and the signal voltage Vsig is written to the gate node of the driving transistor Tr2, and then, the driving signal AZ is brought into a non-active state.

Specifically, the self-discharge ends, and the writing scanning signal WS is brought into an active state at the time t16. In response, the sampling transistor Tr1 is brought into a conduction state. Thus, while the source node of the driving transistor Tr2 is in a floating state, the signal voltage Vsig=Vccp is written by sampling performed by the sampling transistor Tr1.

At the time t17, writing of the signal voltage Vsig is completed. Thus, the source voltage Vs of the driving transistor Tr2 is fixed at the power source voltage Vcc (in the non-floating state). At this time, the gate voltage Vg of the driving transistor Tr2 is increased by a bootstrap operation.

After that, at the time t18, the light emission control signal DS is brought into an active state, and in response, the light emission control transistor Tr3 is brought into a conduction state. At this time, as described above, capacitive coupling by parasitic capacitance between the gate node of the light emission control transistor Tr3 and the gate node of the driving transistor Tr2 decreases the gate voltage Vg, and the gate voltage Vg of the driving transistor Tr2 becomes lower than the source voltage Vs.

Then, at a time t25, the driving signal AZ is brought into a non-active state, and the switching transistor Tr4 is brought into a non-conduction state. Further, because the driving signal AZ is changed from an active state to a non-active state, coupling by the capacitance C1 increases the gate voltage Vg of the driving transistor Tr2. That is, at the time t25, the driving signal AZ is brought into a non-active state, so that the organic EL element 21 is switched from a non-light-emission state to a light-emission state, and in synchronization with the switching, the gate voltage Vg of the driving transistor Tr2 is controlled to be higher than the source voltage Vs. Accordingly, even in a case in which the organic EL element 21 is switched to a light-emission state, the leakage current Isd between the source and the drain of the driving transistor Tr2 is suppressed.

Note that, in the above description, the light emission control signal DS is brought into an active state at the time t18, and then the driving signal AZ is brought into a non-active state at the time t25; however, there is no particular limitation on timing at which the driving signal AZ is brought into a non-active state as long as the timing is after writing of the signal voltage Vsig. As a specific example, after the driving signal AZ is brought into a non-active state, the light emission control signal DS may be brought into an active state (that is, timing at the time t18 and timing at the time t25 may be interchanged).

Further, in the above description, an example of using a p-channel type transistor as each of the sampling transistor Tr1, the driving transistor Tr2, the light emission control transistor Tr3, and the switching transistor Tr4 is shown; however, the present disclosure is not necessarily limited to this configuration. For example, an n-channel type transistor may be used as some or all of the sampling transistor Tr1, the driving transistor Tr2, the light emission control transistor Tr3, and the switching transistor Tr4. It is needless to say that, in a case in which an n-channel type transistor is used, among signals shown in FIG. 6 (i.e., the light emission control signal DS, the scanning signal WS, the signal voltage Vsig/the reference voltage Vofs, and the driving signal AZ), the signal corresponding to the transistor is reversed. Further, the transistor is not necessarily limited to an insulated gate field effect transistor as long as each function of the sampling transistor Tr1, the driving transistor Tr2, the light emission control transistor Tr3, and the switching transistor Tr4 can be achieved.

In the above embodiment, an example in which the self-discharge is performed by setting the gate node and the source node of the driving transistor Tr2 to be in a floating state is shown; however, there is no particular limitation on the configuration as long as a potential of each node is discharged. As s specific example, discharge may be performed in the state in which the sampling transistor Tr1 is brought into a conduction state and the reference voltage Vofs is retained at the gate node of the driving transistor Tr2.

Figure 7:
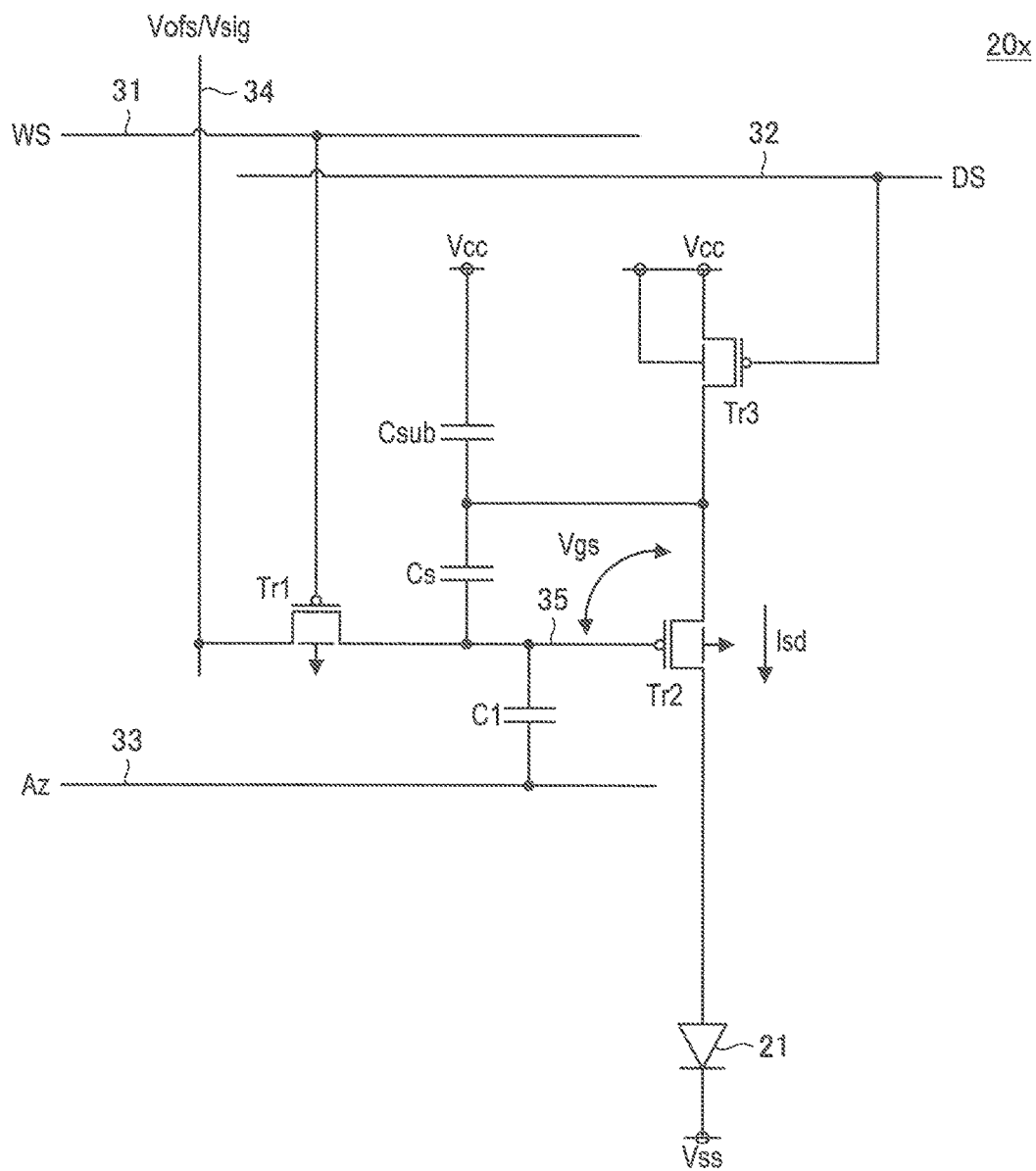
FIG. 7 is a circuit diagram showing another embodiment of a pixel (pixel circuit) in a display device according to an embodiment.
Figure 8:
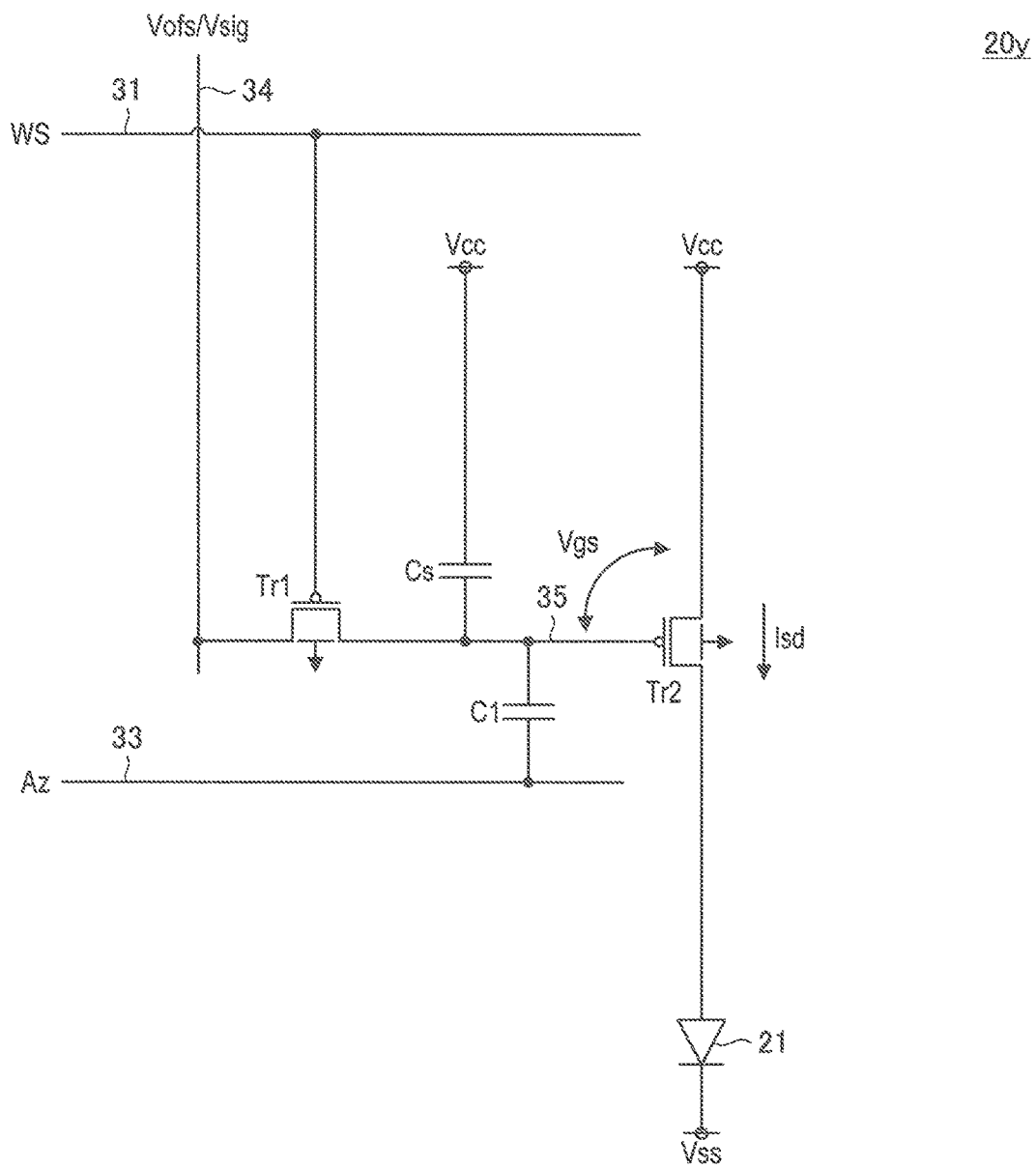
FIG. 8 is a circuit diagram showing another embodiment of a pixel (pixel circuit) in a display device according to an embodiment.

Further, the circuit of the pixel 20 is not necessarily limited to the example shown in FIG. 5 as long as the gate voltage Vg of the driving transistor Tr2 can be controlled by capacitive coupling by the capacitance C1. For example, FIG. 7 is a circuit diagram showing another embodiment (referred to as pixel 20x) of the pixel (pixel circuit) 20. As shown in FIG. 7, the switching transistor Tr4 may not be provided. In this case, the signal line 33 is used only for control of the gate voltage Vg based on capacitive coupling by the capacitance C1. Further, the pixel (pixel circuit) 20 may have a circuit configuration shown in FIG. 8. FIG. 8 is a circuit diagram showing another embodiment (referred to as pixel 20y) of the pixel (pixel circuit) 20, and is an example in which the circuit configuration of the pixel 20x shown in FIG. 7 is further simplified (that is, an example in which the configuration related to switching between light emission and non-light-emission of the organic EL element 21 is simplified).

[1.8. Conclusion]

As described above, according to the pixel circuit according to this embodiment and the driving method of the same, in a case in which black gradation is displayed, control is possible in a manner that the leakage current Isd between the source and the drain of the driving transistor Tr2 is suppressed. Accordingly, in the display device according to this embodiment, in a case in which black gradation is displayed, the light emission of the organic EL element 21 due to the leakage current Isd can be suppressed, and further, a decrease in the contrast can be suppressed (that is, the contrast can be increased).

2. Example of Display Device and Pixel Circuit

Next, specific example related to the formation of the capacitance C1 will be described below as examples particularly focusing on the structure of the pixel (pixel circuit) 20 (see FIG. 5) in the display device 10 according to the above described embodiment.

2.1. Example 1

Figure 9:
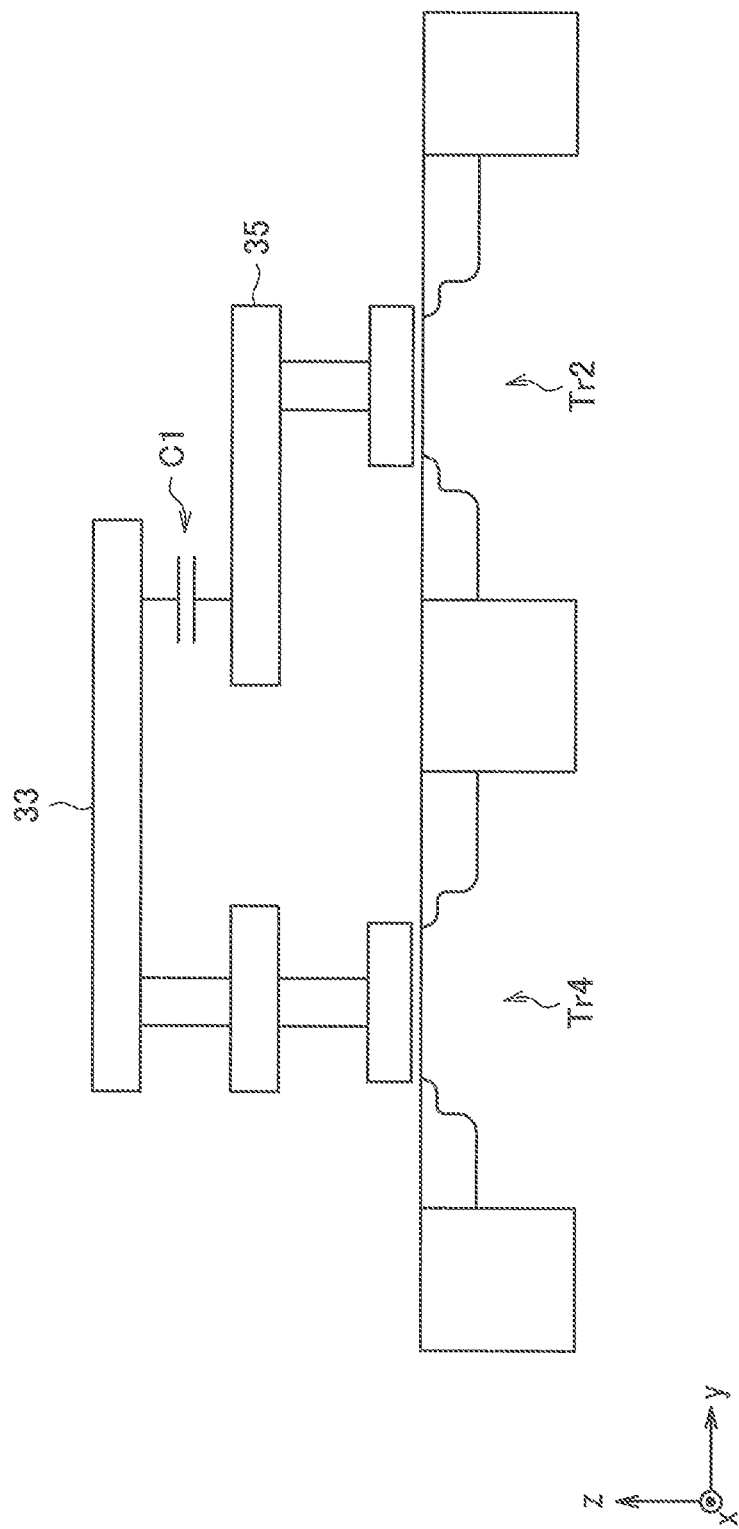
FIG. 9 is a schematic cross-sectional view showing a structure of a pixel (pixel circuit) according to an example 1.

First, an example in which the capacitance C1 is formed as parasitic capacitance between the signal line 33 and the signal line 35 in the pixel 20 according to the above described embodiment will be described as an example 1 with reference to FIG. 9. FIG. 9 is a schematic cross-sectional view showing the structure of the pixel (pixel circuit) 20 according to the example 1.

FIG. 9 shows a schematic connection relation among the driving transistor Tr2, the switching transistor Tr4, the signal line 33, and the signal line 35, the signal line 33 being configured to supply the driving signal AZ, the signal line 35 being connected to the gate node of the driving transistor Tr2.

Note that in FIG. 9, the direction that is perpendicular to the figure is defined as a x-direction, the lateral direction in the figure is defined as a y-direction, and the vertical direction in the figure is defined as a z-direction. That is, in the example shown in FIG. 9, an example of a multi-layer structure is shown in which xy planes are laminated as layers in the z-direction and the driving transistor Tr2, the switching transistor Tr4, the signal line 33, and the signal line 35 are arranged at different levels.

In particular, as shown in FIG. 9, in the pixel 20 according to this example, the signal line 33 and the signal line 35 are disposed as layers that are adjacent to each other and are in parallel to each other.

Such a structure generates parasitic capacitance in a part where the signal line 33 and the signal line 35 are parallel to each other (that is, a part where the signal line 33 and the signal line 35 are superimposed in the z-direction). That is, in the pixel 20 according to this embodiment, by use of the parasitic capacitance between the signal line 33 and the signal line 35 as the capacitance C1, capacitive coupling by the capacitance C1 enables the gate voltage Vg of the driving transistor Tr2 to be controlled.

Note that the control amount of the gate voltage Vg is decided on the basis of the electrostatic capacity of the capacitance C1. Accordingly, it is needless to say that the control amount of the gate voltage Vg can be adjusted by adjusting the area where the signal line 33 and the signal line 35 are superimposed and the width between the signal line 33 and the signal line 35.

Note that in this case, the signal line 33 (i.e., the first signal line) may be provided in a manner that the area of the signal lines (the area on the xy planes in FIG. 9) becomes the largest in the part where the signal line 33 (i.e., the first signal line) and the signal line 35 (i.e., the second signal line) are superimposed (i.e., the part where the capacitance C1 is formed).

2.2. Example 2

Figure 10:
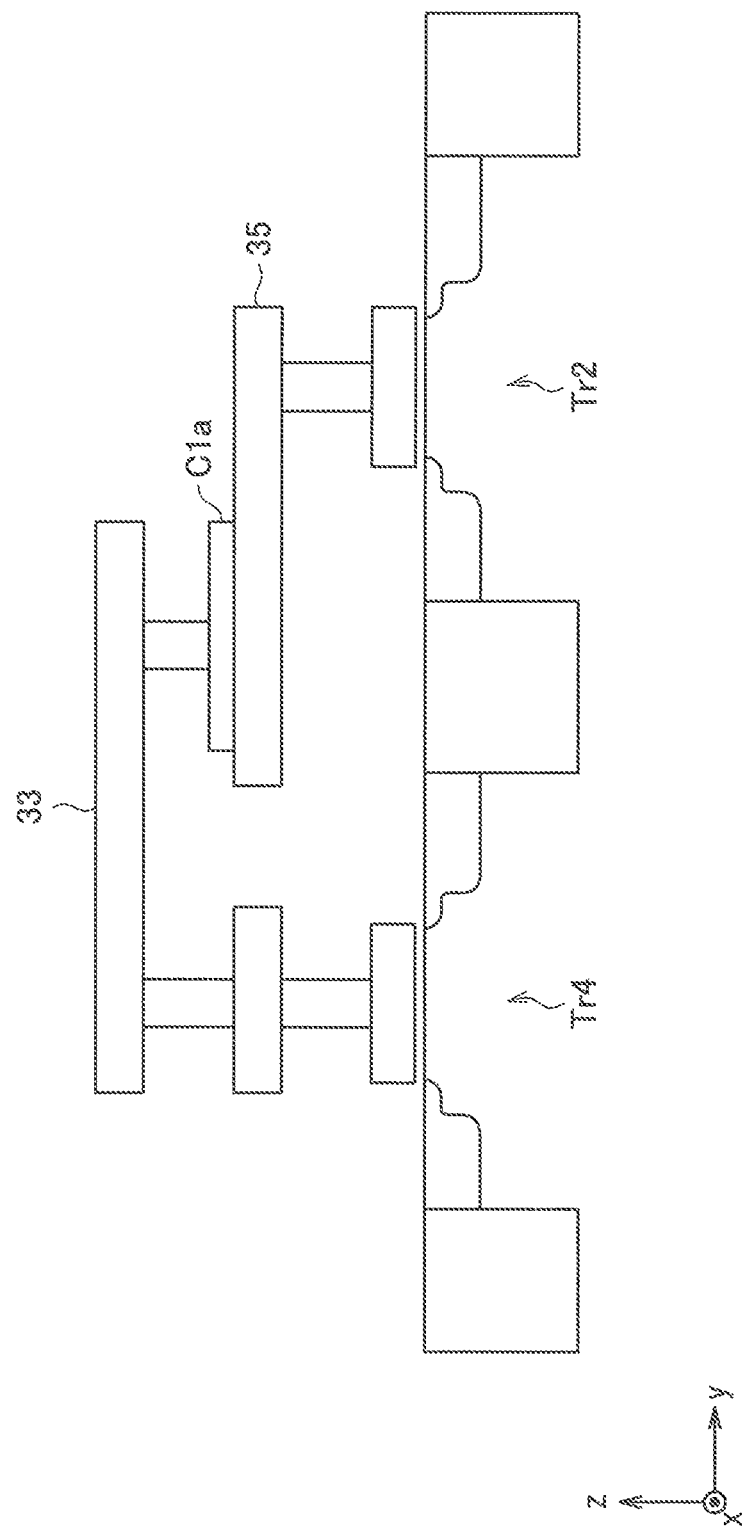
FIG. 10 is a schematic cross-sectional view showing a structure of a pixel (pixel circuit) according to an example 2.

Next, an example in which the capacitance C1 is formed by provision of a capacitor between the signal line 33 and the signal line 35 will be described as an example 2 with reference to FIG. 10. FIG. 10 is a schematic cross-sectional view showing the structure of the pixel (pixel circuit) 20 according to the example 2. Note that FIG. 10 employs the same coordination system as FIG. 9.

In the example shown in FIG. 10, the positional relation among the driving transistor Tr2, the switching transistor Tr4, the signal line 33, and the signal line 35 is the same as that in the case of the pixel 20 according to the example 1 shown in FIG. 9. On the other hand, the example shown in FIG. 10 is different from the case of the pixel 20 according to the example 1 shown in FIG. 9 in that the capacitance C1 is formed by provision of a capacitance C1a between the signal line 33 and the signal line 35.

As the capacitance C1a, for example, a capacitor having a so-called metal-insulator-metal (MIM) structure in which an insulating layer is interposed between metal layers can be used. It is needless to say that the mode of the capacitance C1 is not limited to the capacitor having the MIM structure as long as the capacitance C1 can be formed between the signal line 33 and the signal line 35.

As described above, in the pixel 20 according to this example, the capacitance C1 is formed by provision of the capacitance C1a between the signal line 33 and the signal line 35, and capacitive coupling by the capacitance C1 enables the gate voltage Vg of the driving transistor Tr2 to be controlled.

2.3. Example 3

Figure 11:
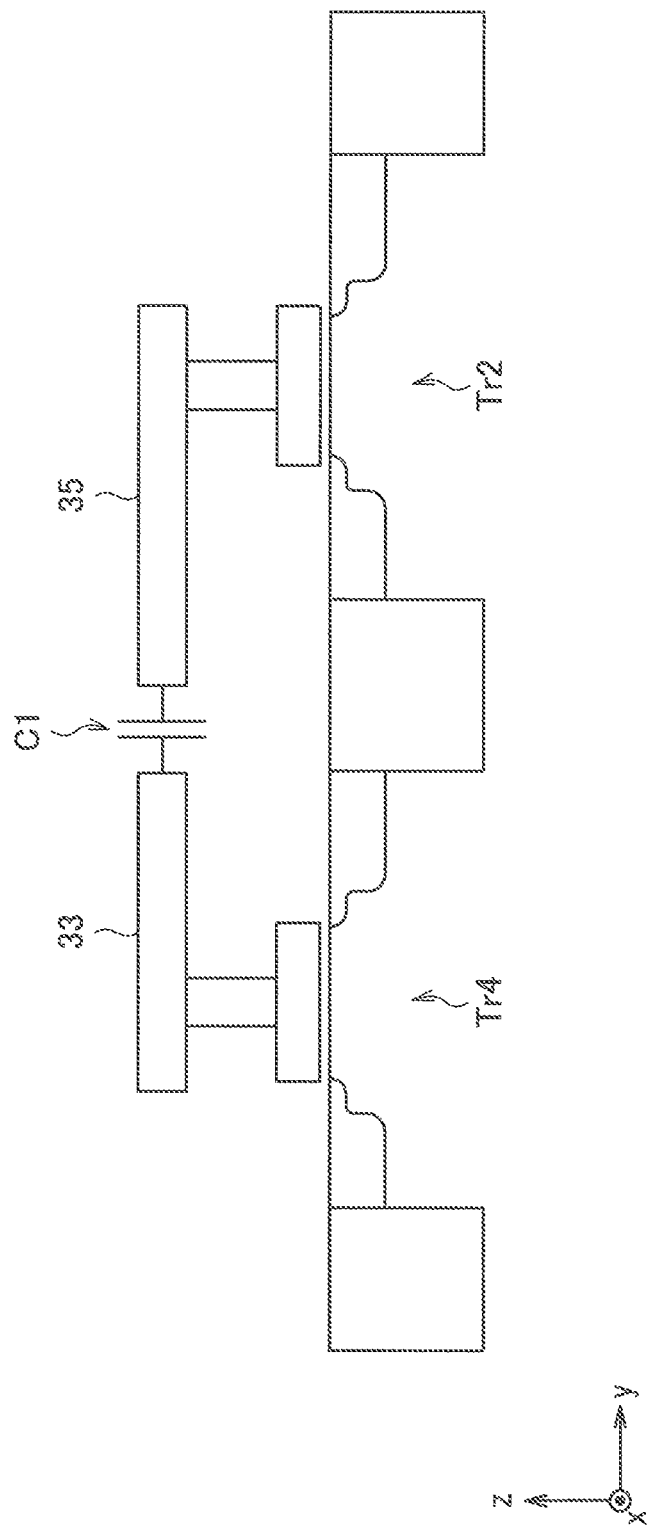
FIG. 11 is a schematic cross-sectional view showing a structure of a pixel (pixel circuit) according to an example 3.

Next, another example in which the capacitance C1 is formed as parasitic capacitance between the signal line 33 and the signal line 35 will be described as an example 3 with reference to FIG. 11. FIG. 11 is a schematic cross-sectional view showing the structure of the pixel (pixel circuit) 20 according to the example 3. Note that FIG. 11 employs the same coordinate system as FIG. 9.

The example shown in FIG. 11 is different from the pixel 20 according to the example 1 shown in FIG. 9 in that the signal line 33 and the signal line 35 are formed on the same level. That is, in a case in which the thickness of the signal line 33 and the signal line 35 along the z-direction is large enough to be able to form the capacitance C1, the capacitance C1 can be formed by parasitic capacitance between the signal line 33 and the signal line 35 which are formed on the same level.

Specifically, as shown in FIG. 11, in the pixel 20 according to this example, the signal line 33 and the signal line 35 are provided to be adjacent to each other and in parallel to each other on the same level. For example, in a case of the example shown in FIG. 11, the signal line 33 and the signal line 35 are provided to be adjacent to each other in the y-direction and in parallel to each other in the x-direction.

Note that in this case, the signal line 33 (i.e., the first signal line) may be provided in a manner that the inter-wiring distance between the signal line 33 (i.e., the first signal line) and the signal line 35 (i.e., the second signal line) becomes the shortest in a part where the signal line 33 (i.e., the first signal line) and the signal line 35 (i.e., the second signal line) are in parallel to each other (i.e., the part where the capacitance C1 is formed).

Such a structure generates parasitic capacitance in a part where the signal line 33 and the signal line 35 are parallel to each other. That is, in the pixel 20 according to this example, by use of the parasitic capacitance between the signal line 33 and the signal line 35 as the capacitance C1, capacitive coupling by the capacitance C1 enables the gate voltage Vg of the driving transistor Tr2 to be controlled.

2.4. Example 4

Next, the display device 10 according to an example 4 will be described. As described above, each of the pixels 20 can be formed as sub-pixels of mutually different colors; for example, a sub-pixel that emits red light, a sub-pixel that emits green light, a sub-pixel that emits blue light, and a sub-pixel that emits white light can be formed as one pixel.

Meanwhile, in many cases, contrast due to a change in current (i.e., the current Isd) supplied to each organic EL element 21 affects differently on the sub-pixel that emits red light, the sub-pixel that emits green light, the sub-pixel that emits blue light, and the sub-pixel that emits white light.

For example, in a case of outputting red light, green light, and blue light, light emitted from the organic EL element 21 is outputted outside through a color filter, so that the red light, the green light, and the blue light can be outputted. In contrast, in a case of outputting white light, light emitted from the organic EL element 21 is outputted not through a color filter, so that the white light can be outputted.

In a case of using a color filter as in a case of outputting red light, green light, and blue light, light emitted from the organic EL element 21 attenuates by passing through the color filter. Accordingly, even when the amount of current supplied to the organic EL element 21 is changed, since light passes through the color filter, the amount of change of light emitted from the organic EL element 21 due to the change in current also attenuates. In contrast, in a case of outputting white light, since light emitted from the organic EL element 21 is outputted not through a color filter, a change in the amount of current supplied to the organic EL element 21 affects more than in a case of outputting red light, green light, and blue light.

In consideration of such cases, in the display device 10 according to the example 4, different values are set as the control amount of the gate voltage Vg depending on the type of light corresponding to each of the pixels 20 (i.e., the type of light outputted from the pixels 20 to the outside). Specifically, in the display device 10 according to the example 4, the control amount of the gate voltage Vg in the pixel 20w, which outputs white light is set to be larger than that of the pixel 20r, the pixel 20g, and the pixel 20b, which output red light, green light, and blue light, respectively. That is, in the display device 10, the capacitance C1 is formed in each of the pixels 20 in a manner that the electrostatic capacity of the capacitance C1 provided in the pixel 20w becomes larger than the electrostatic capacity of the capacitance C1 formed in the pixel 20r, the pixel 20g, and the pixel 20b.

Figure 12:
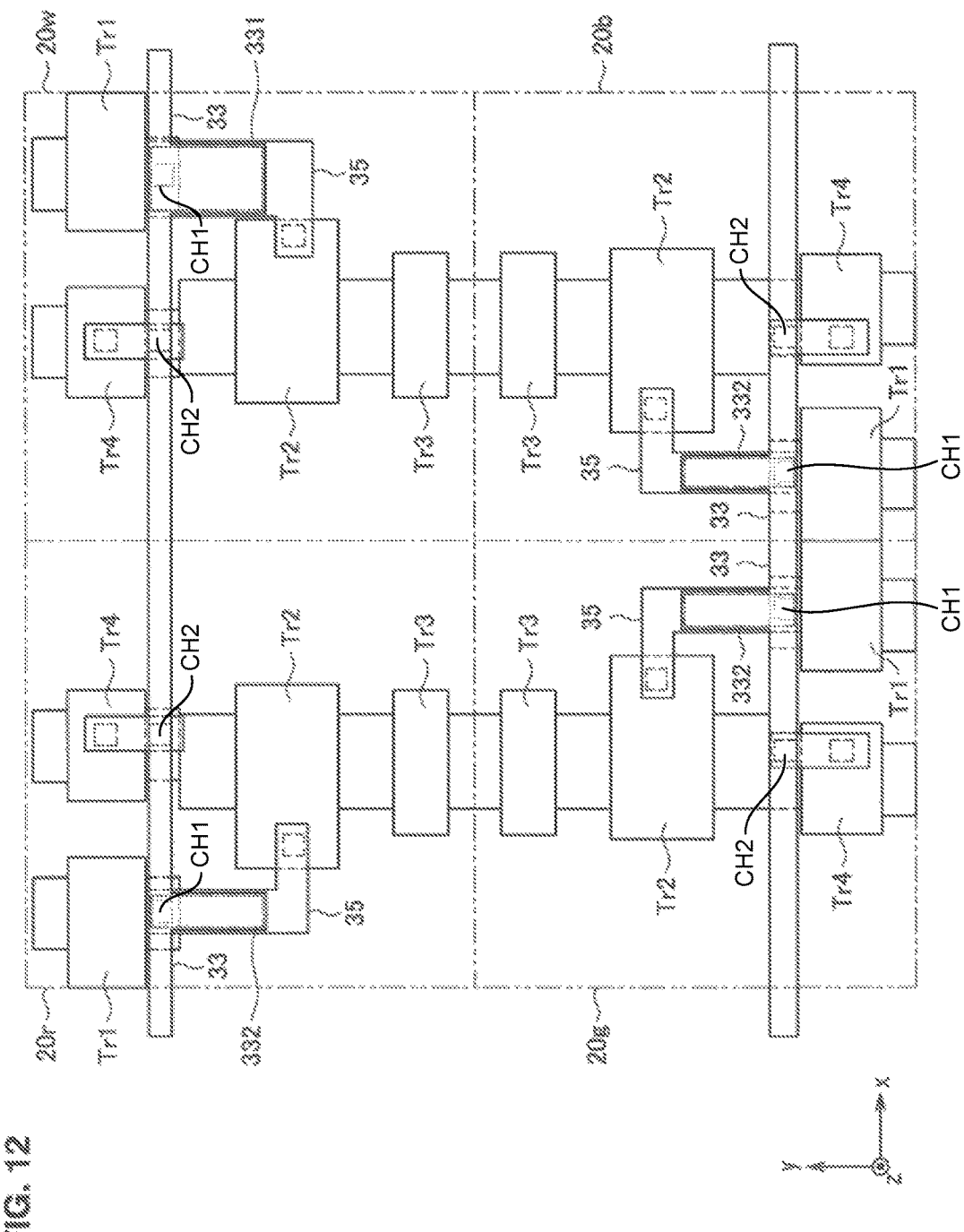
FIG. 12 is a schematic plan view showing a configuration of a display device according to an example 4.

For example, FIG. 12 is a schematic plan view showing the configuration of the display device 10 according to this example, and shows an example of the configuration for achieving the display device 10 according to this example.

Note that in FIG. 12, the lateral direction in the figure is defined as an x-direction, the vertical direction in the figure is defined as a y-direction, and the direction that is perpendicular to the figure is defined as a z-direction. That is, in the example shown in FIG. 12, a multi-layer structure is formed in which xy planes are laminated as layers in the z-direction and the sampling transistor Tr1, the driving transistor Tr2, the light emission control transistor Tr3, and the switching transistor Tr4 are arranged at an identical level.

Further, in the display device 10 according to this example shown in FIG. 12, in each of the pixels 20, the capacitance C1 is formed in the same manner as that in the example 1. That is, in the example shown in FIG. 12, each of the transistors Tr1 to Tr4, the signal line 33 which supplies the driving signal AZ to the switching transistor Tr4 via contact hole CH2, and the signal line 35 which is connected to the gate node of the driving transistor Tr2 via contact hole CH1, are disposed at different levels. Specifically, the level at which the signal line 35 is provided is above and adjacent to the level at which each of the transistors Tr1 to Tr4 is provided. Further, the level at which the signal line 33 is provided is adjacent to the level at which the signal line 35 is provided. Further, in the pixels 20, at least some parts of the signal line 33 and signal line 35 are provided in parallel to each other, and the capacitance C1 is formed in a part where the signal line 33 and the signal line 35 are parallel to each other (that is, a part where the signal line 33 and the signal line 35 are superimposed in the z-direction).

In this case, for example, a region 331 in the pixel 20w where the signal line 33 and the signal line 35 are superimposed is formed to have a larger area than a region 332 in the pixels 20r, 20g, and 20b where the signal line 33 and the signal line 35 are superimposed. Such a configuration makes the electrostatic capacity of the capacitance C1 in the pixel 20w larger than the electrostatic capacity of the capacitance C1 in the pixels 20r, 20g, and 20b. That is, in the display device 10 shown in FIG. 12, the control amount of the gate voltage Vg in the pixel 20w which outputs white light is larger than that in the pixels 20r, 20g, and 20b which output red light, green light, and blue light, respectively.

Note that the adjustment of the electrostatic capacity of the capacitance C1 formed in each pixel is not limited to the viewpoint of whether the light emitted from the organic EL element 21 is outputted through a color filter or not, as described above. As a specific example, in many cases, a change in the visibility due to a change in the light emission amount of white light is more significant than a change in the visibility due to a change in the light emission amount of red light, green light, and blue light. Accordingly, regardless of whether a color filter is present or not, the capacitance C1 may be formed in each of the pixels 20 in a manner that the electrostatic capacity of the capacitance C1 formed in the pixel 20 that emits white light becomes larger than the electrostatic capacity of the capacitance C1 formed in the pixels 20 that emit red light, green light, and blue light. As another example, the electrostatic capacity of the capacitance C1 in the pixel 20 may be formed in accordance with the light emission amount (e.g., luminance) of the organic EL element 21. That is, the capacitance C1 may be formed in a manner that the pixel 20 having a larger light emission amount of the organic EL element 21 has a larger electrostatic capacity of the capacitance C1 formed in the pixel 20.

Further, in a case in which the electrostatic capacity of the capacitance C1 in the pixel 20w is formed to be larger than the electrostatic capacity of the capacitance C1 in each of the pixels 20r, 20g, and 20b, the present disclosure is not limited to the example in which the electrostatic capacity is adjusted in accordance with the area where the signal line 33 and the signal line 35 are superimposed as shown in FIG. 12. For example, it is needless to say that, in a case in which the capacitance C1 is formed by provision of a capacitor between the signal line 33 and the signal line 35, the electrostatic capacity of the capacitance C1 in each of the pixels 20 may be adjusted by adjustment of the dielectric constant between electrodes of the capacitor (i.e., by selection of a dielectric or an insulator interposed between the electrodes).

3. Electronic Device

The above described display device according to an embodiment of the present disclosure can be used for a display unit (display device) in an electronic device in a variety of fields in which image signals inputted to the electronic device or image signals generated within the electronic device are displayed as an image or a moving image. In this case, for example, a control unit (e.g., a central processing unit (CPU) or a micro-processing unit (MPU)) of the electronic device may control the operation of the writing scanning unit 40, the first driving scanning unit 50, the second driving scanning unit 60, and the signal output unit 70 in the display device. As another example, some or all of functions of the writing scanning unit 40, the first driving scanning unit 50, the second driving scanning unit 60, and the signal output unit 70 in the display device may be provided in the control unit of the electronic device.

As is clear from the description of the above embodiment, the display device according to an embodiment of the present disclosure, in a case in which black gradation is displayed, control is possible in a manner that the leakage current Isd between the source and the drain of the driving transistor Tr2 is suppressed. Accordingly, in the display device according to this embodiment, in a case in which black gradation is displayed, the light emission of the organic EL element 21 due to the leakage current Isd can be suppressed, and further, a decrease in the contrast can be suppressed (that is, the contrast can be increased).

Examples of the display device in which the display device according to an embodiment of the present disclosure is used for a display unit include, in addition to a television system, a head-mounted display, a digital camera, a video camera, an EVF, a game machine, a laptop personal computer, and the like. Further, the display device according to an embodiment of the present disclosure can also be used for a display unit in an electronic device such as a mobile information device including an electronic book device and an electronic watch, or a mobile communication device including a cell phone and a PDA.

4. Module and Application Examples

A module and application examples of the above described display device according to an embodiment will be described below by taking some specific examples.

4.0. Module

Figure 13:
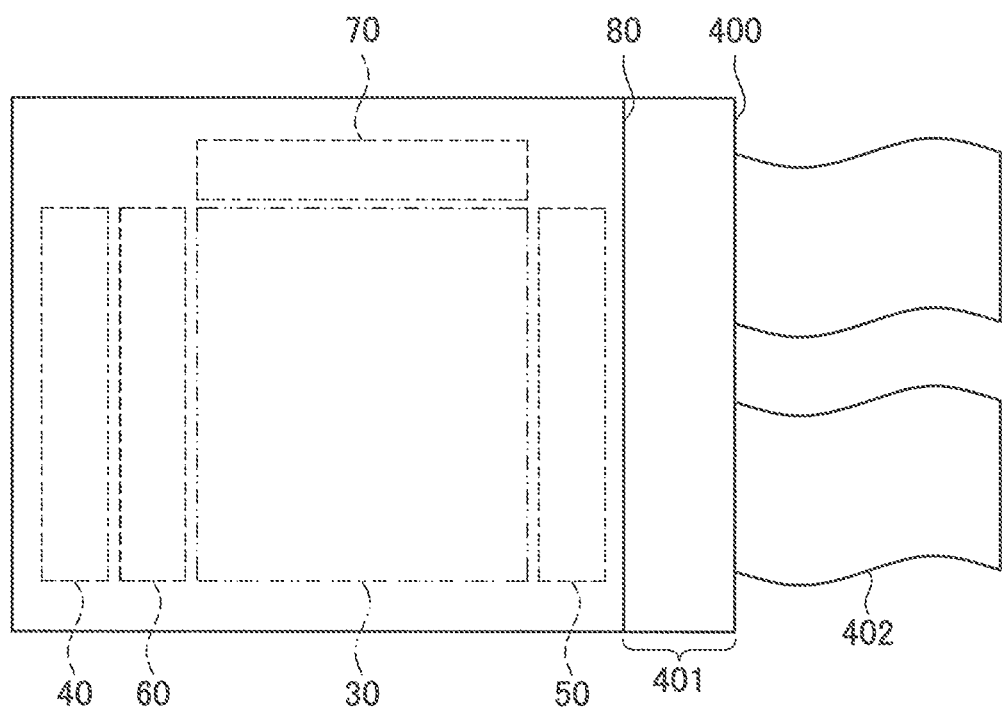
FIG. 13 is a plan view showing a schematic configuration of a module of a display device according to an embodiment.

The display device according to an embodiment is incorporated in an electronic device such as any of application examples 1 to 8 described later, as a module shown in FIG. 13, for example. This module is formed by, for example, providing a region 401 which is exposed from a sealing substrate (the display panel 80) on one side of a substrate 400, and by forming, in this exposed region 401, an external connection terminal (not shown) by extending wirings of the writing scanning unit 40, the first driving scanning unit 50, the second driving scanning unit 60, and the signal output unit 70. The external connection terminal may be provided with a flexible printed circuit (FPC) 402 for input and output of signals.

Figure 14A:
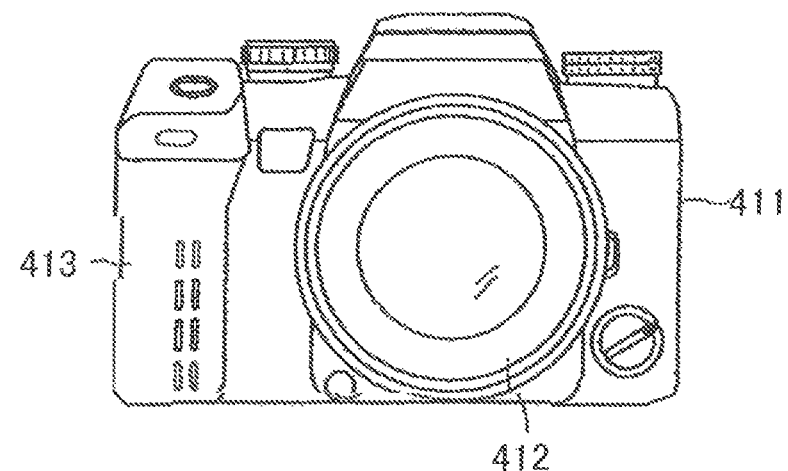
FIGS. 14A and 14B have a front view and a rear view showing the appearance of an application example 1 (a lens interchangeable single-lens reflex type digital camera) of a display device according to an embodiment.
Figure 14B:
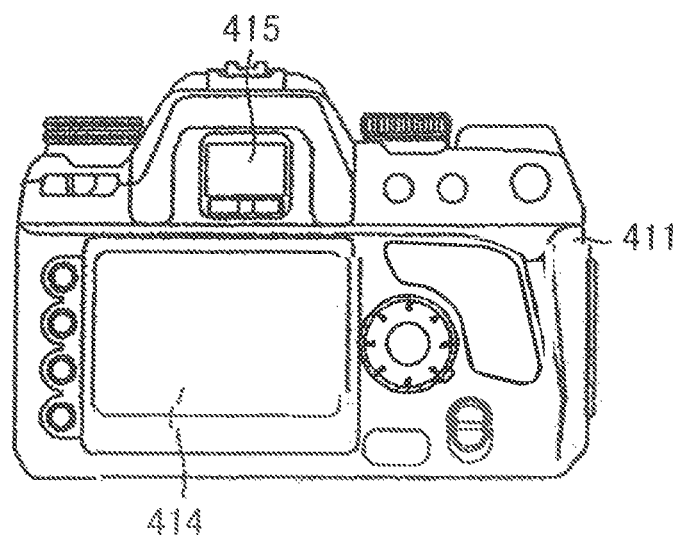

4.1. Application Example 1: Lens Interchangeable Single-Lens Reflex Type Digital Camera FIG. 14 shows the appearance of an imaging apparatus (a lens interchangeable single-lens reflex type digital camera) to which the display device according to an embodiment is applied. This imaging apparatus include, for example, an interchangeable imaging lens unit (an interchangeable lens) 412 on the right of the front of a camera main body portion (camera body) 411, and a grip portion 413 on the left of the front, where a photographer grips. A monitor 414 is provided at substantially the center of a back surface of the camera main body portion 411. A viewfinder (an eye piece window) 415 is provided above the monitor 414. By looking through the viewfinder 415, the photographer can recognize an image of a subject guided from the imaging lens unit 412 to decide the composition. The viewfinder 415 is formed by the display device according to an embodiment.

4.2. Application Example 2: Head-Mounted Display

Figure 15:
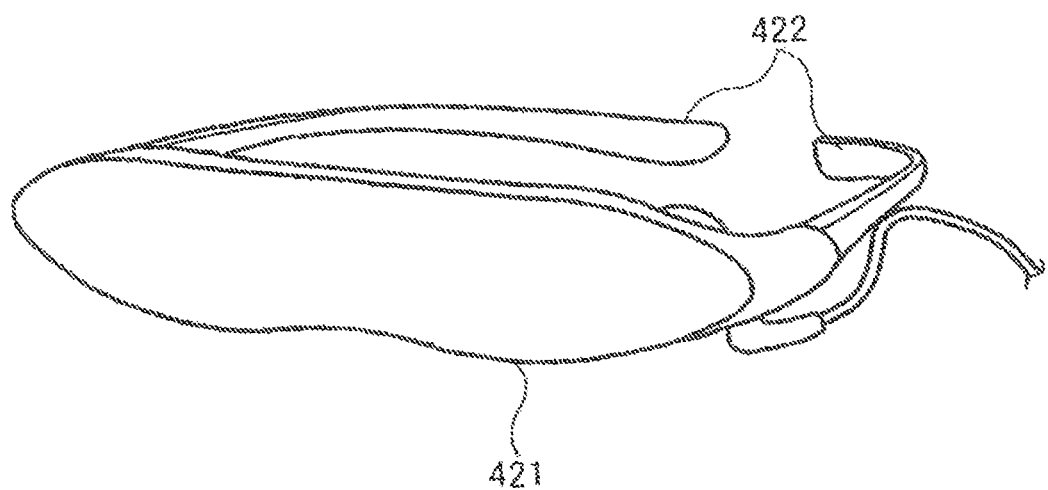
FIG. 15 is a perspective view showing the appearance of an application example 2 (a head-mounted display) of a display device according to an embodiment.

FIG. 15 shows the appearance of a head-mounted display to which the display device according to an embodiment is applied. This head-mounted display includes, for example, ear-hooking portions 422 for wearing on the head of a user, on both sides of a display unit 421 having a shape of glasses. The display unit 421 is formed by the display device according to an embodiment.

4.3. Application Example 3: Smartphone

Figure 16A:
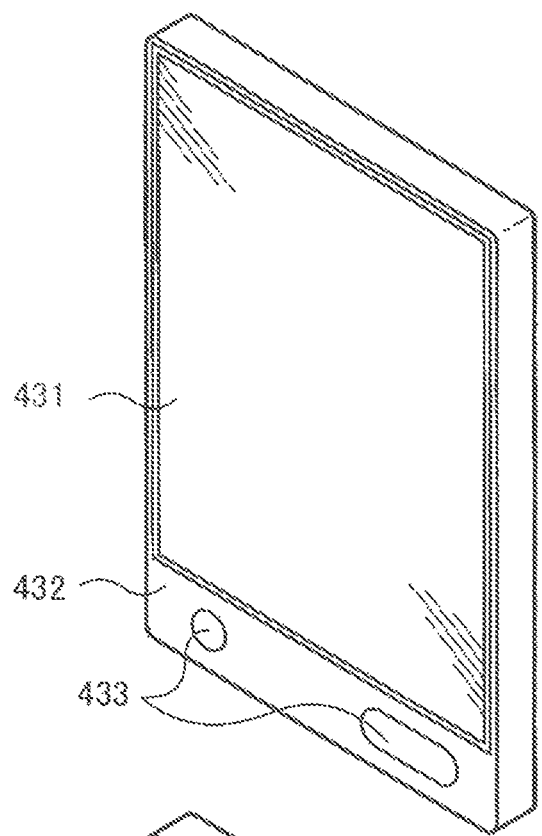
FIGS. 16A and 16B are perspective views showing the appearance of an application example 3 (a smartphone) of a display device according to an embodiment.
Figure 16B:
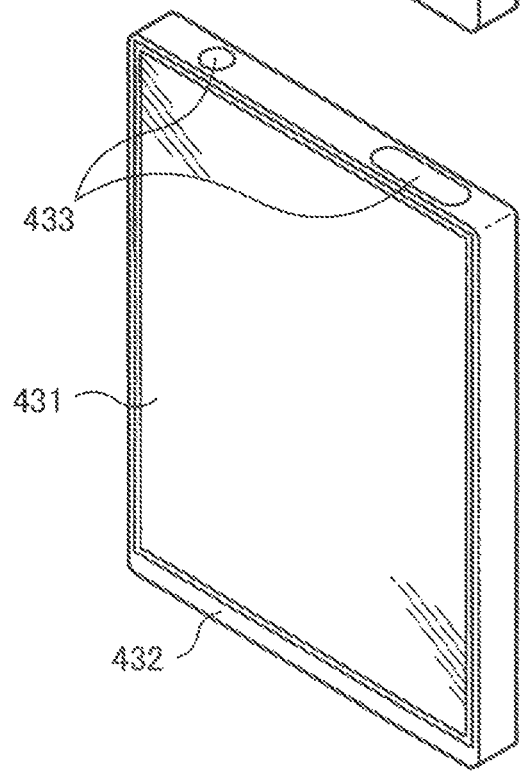

FIG. 16 shows the appearance of a smartphone. This smartphone includes, for example, a display unit 431 (the display device 10), a non-display unit (a housing) 432, and operation units 433. The operation units 433 may be provided on the front surface of the non-display unit 432 as shown in (A) or may be provided on the top surface thereof as shown in (B).

4.4. Application Example 4: Television Device

FIG. 17 shows the appearance configuration of a television device. This television device includes, for example, an image display screen portion 440 (the display device 10) including a front panel 441 and a filter glass 442.

4.5. Application Example 5: Digital Camera

FIG. 18 shows the appearance configuration of a digital still camera, the front surface of which is shown in (A) and the back surface of which is shown in (B). This digital still camera includes, for example, a light emitting unit 451 for flash, a display unit 452 (the display device 10), a menu switch 453, and a shutter button 454.

4.6. Application Example 6: Personal Computer

Figure 19:
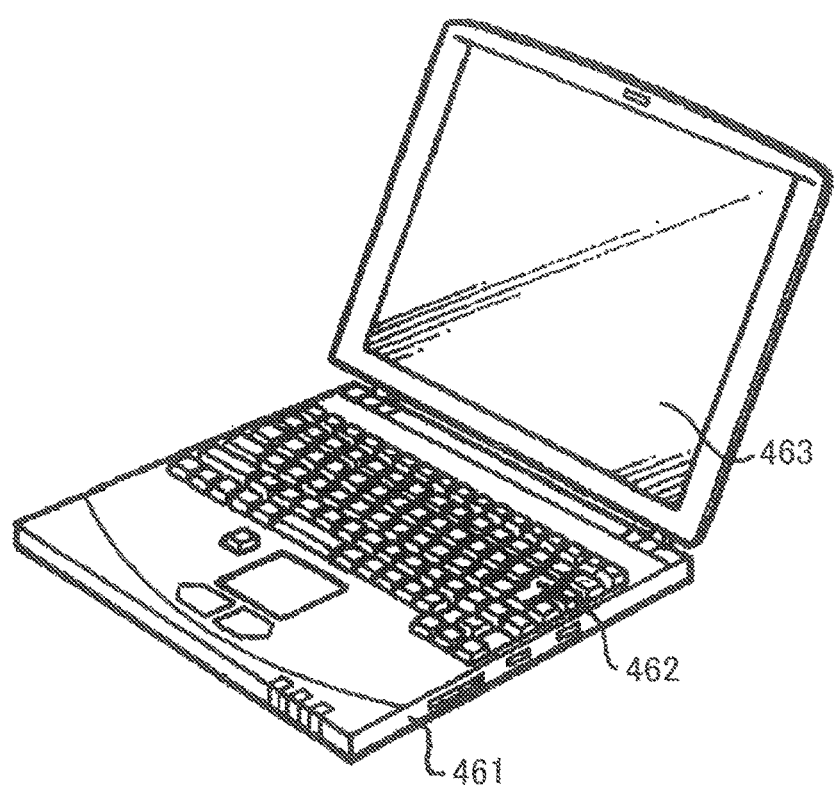
FIG. 19 is a perspective view showing the appearance of an application example 6 (a personal computer) of a display device according to an embodiment.

FIG. 19 shows the appearance configuration of a laptop personal computer. This personal computer includes, for example, a main body 461, a keyboard 462 for input operation of characters and the like, a display unit 463 (the display device 10) which displays images.

4.7. Application Example 7: Video Camera

Figure 20:
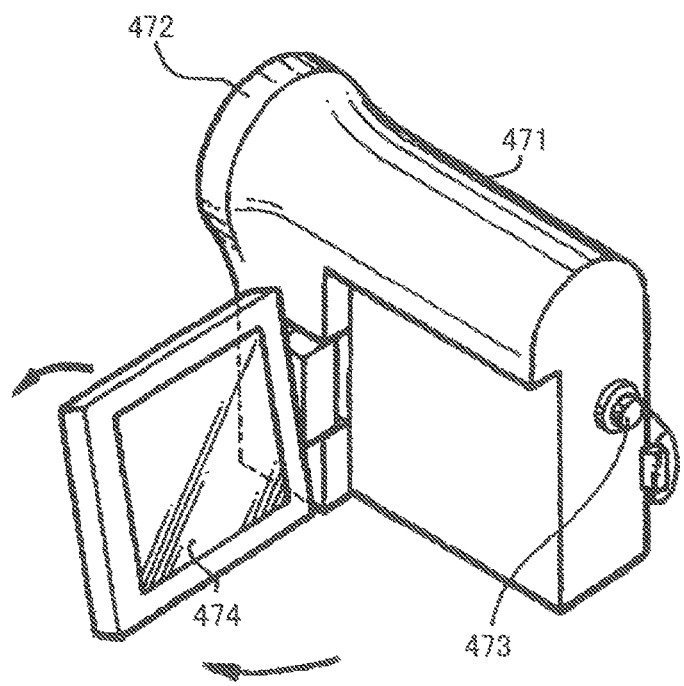
FIG. 20 is a perspective view showing the appearance of an application example 7 (a video camera) of a display device according to an embodiment.

FIG. 20 shows the appearance configuration of a video camera. This video camera includes, for example, a main body unit 471, a lens 472 for imaging a subject, the lens 472 being provided on the front side surface of the main body unit 471, a start/stop switch 473 which starts and stops imaging, and a display unit 474 (the display device 10).

4.8. Application Example 8: Cell Phone Device

FIG. 21 shows the appearance configuration of a cell phone device. (A) and (B) show the front surface and a side surface, respectively, in the state where the cell phone device is open. (C), (D), (E), (F), and (G) show the front surface, the left side surface, the right side surface, the top surface, and the bottom surface, respectively, in the state where the cell phone device is closed. In this cell phone device, for example, an upper housing 481 and a lower housing 482 are connected to each other via a connection portion (a hinge portion) 483, and the cell phone device includes a display 484 (the display device 10), a sub-display 485, a picture light 486, and a camera 487.

Although the preferred embodiments of the present disclosure have been described in detail with reference to the appended drawings, the present disclosure is not limited thereto. It should be understood by those skilled in the art that various modifications, combinations, sub-combinations and alterations may occur depending on design requirements and other factors insofar as they are within the scope of the appended claims or the equivalents thereof.

The effects described in the specification are just explanatory or exemplary effects, and are not limiting. That is, the technology according to the present disclosure can exhibit other effects that are apparent to a person skilled in the art from the descriptions in the specification, along with the above effects or instead of the above effects.

Additionally, the present technology may also be configured as below.

(1)

A display device including:

a driving transistor including a control terminal, a first terminal, and a second terminal, the driving transistor being configured to control supply of current to a light emitting element in accordance with a signal voltage applied to the control terminal, the light emitting element being connected to the first terminal and configured to emit light in accordance with an amount of the current;

a switching unit configured to be capable of switching a conduction state and a non-conduction state, the switching unit being configured to, by being brought in the conduction state, form a path that bypasses the light emitting element in a manner that the current is not supplied to the light emitting element; and a control unit configured to perform control in a manner that the switching unit is brought in the non-conduction state from the conduction state after the signal voltage is written into the control terminal, the control unit being configured to control a potential of the control terminal in synchronization with the control of the switching unit.

(2)
The display device according to (1),
wherein the control unit controls switching between the conduction state and the non-conduction state by supplying a control signal to the switching unit via a first signal line,
wherein a capacitance is formed between the first signal line and a second signal line connected to the control terminal, and
wherein the potential of the control terminal is controlled by the control signal being supplied to the control terminal via the capacitance.
(3)
The display device according to (2),
wherein the capacitance is formed by the first signal line and the second signal line being provided adjacently to each other and in parallel to each other.
(4)
The display device according to (3), wherein the first signal line and the second signal line are provided as different layers that are adjacent to each other in a wiring having a multi-layer structure, and
wherein the capacitance is formed by the first signal line and the second signal line being superimposed on each other.
(5)
The display device according to (4),
wherein the first signal line is provided in a manner that an area of the signal line becomes maximum in a part superimposed on the second signal line.
(6)
The display device according to (3),
wherein the first signal line and the second signal line are formed as a wiring at an identical level, and
wherein the capacitance is formed by the first signal and the second signal line being provided adjacently to each other and in parallel to each other at the identical level.
(7)
The display device according to (6),
wherein the first signal line is provided in a manner that an inter-wiring distance becomes minimum in a part where the first signal line is in parallel to the second signal line.
(8)
The display device according to any one of (1) to (7),
wherein the display device includes a plurality of pixels each including the light emitting element, the driving transistor, and the switching unit,
wherein the control unit controls a potential difference between the control terminal and the second terminal of the driving transistor in each of the plurality of pixels in accordance with light corresponding to the pixels.
(9)
The display device according to (8),
wherein light emitted from a light emitting element in a first pixel among the plurality of pixels is outputted outside through a color filter, and light emitted from a light emitting element in a second pixel that is different from the first pixel is outputted outside not through the color filter,
wherein the control unit controls a potential of the control terminal of the driving transistor in each of the first pixel and the second pixel in a manner that a potential difference between the control terminal and the second terminal of the driving transistor in the second pixel becomes larger than a potential difference between the control terminal and the second terminal of the driving transistor in the first pixel.
(10)
The display device according to (8),
wherein a light emitting element in a first pixel among the plurality of pixels outputs any one of red light, blue light, and green light,
wherein a light emitting element in a second pixel that is different from the first pixel outputs white light, and
wherein the control unit controls a potential of the control terminal of the driving transistor of each of the first pixel and the second pixel in a manner that a potential difference between the control terminal and the second terminal of the driving transistor in the second pixel becomes larger than a potential difference between the control terminal and the second terminal of the driving transistor in the first pixel.
(11)
The display device according to any one of (8) to (10),
wherein for each of the plurality of pixels, a capacitance in accordance with light corresponding to each pixel is formed between a signal line via which the control unit supplies the control signal to the switching unit in each pixel and a signal line connected to the control terminal of the driving transistor in the pixel, and
wherein a potential of the control terminal is controlled by the control signal being supplied to the control terminal of the driving transistor in the pixel via the capacitance corresponding to each of the plurality of pixels.
(12)
An electronic device including:
a driving transistor including a control terminal, a first terminal, and a second terminal, the driving transistor being configured to control supply of current to a light emitting element in accordance with a signal voltage applied to the control terminal, the light emitting element being connected to the first terminal and configured to emit light in accordance with an amount of the current;
a switching unit configured to be capable of switching a conduction state and a non-conduction state, the switching unit being configured to, by being brought in the conduction state, form a path that bypasses the light emitting element in a manner that the current is not supplied to the light emitting element; and
a control unit configured to perform control in a manner that the switching unit is brought in the non-conduction state from the conduction state after the signal voltage is written into the control terminal, the control unit being configured to control a potential of the control terminal in synchronization with the control of the switching unit.
(13)
A driving method of the display device, the driving method including:
controlling, by a driving transistor including a control terminal, a first terminal, and a second terminal, supply of current to a light emitting element in accordance with a signal voltage applied to the control terminal, the light emitting element being connected to the first terminal and configured to emit light in accordance with an amount of the current;
forming a path that bypasses the light emitting element in a manner that the current is not supplied to the light emitting element by controlling the switching unit in a manner that the switching unit is brought into a conduction state, the switching unit being configured to be capable of switching the conduction state and a non-conduction state; and
controlling, by a processor, the switching unit in a manner that the switching unit is brought into the non-conduction state from the conduction state after the signal voltage is written into the control terminal, and controlling a potential of the control terminal in synchronization with the control of the switching unit.

What is claimed is:

1. A display device, comprising:
a first pixel circuit and a second pixel circuit adjacent to the first pixel circuit, the first and second pixel circuits respectively including a first transistor, a second transistor, a driving transistor, a first capacitor, a first wiring, and a second wiring, wherein
in both of the first and second pixel circuits:
a first signal line is connected to a first terminal of the first transistor,
a first electrode of the first capacitor is connected to the second terminal of the first transistor,
a second terminal of the driving transistor is connected to an anode electrode of an organic light emitting device,
the first wiring is connected to a metal layer overlapping with a channel region of the driving transistor via a first contact hole,
the second wiring is disposed over the first wiring,
an overlapping region of the second wiring and the first wiring constitutes a second capacitor,
the second wiring is connected to a third wiring via a second contact hole,
the first wiring and the third wiring are disposed on a same level in a cross-section perspective; and
a shape of the second wiring in the overlapping region of the first pixel circuit and a shape of the second wiring in the overlapping region of the second pixel circuits are different.

2. The display device according to claim 1, wherein the first transistor is a sampling transistor.

3. The display device according to claim 1, wherein the second transistor is a driving switching transistor.

4. The display device according to claim 1, further comprising:
the first and second pixel circuits respectively include a third transistor.

5. The display device according to claim 4, wherein the third transistor is a light emission control transistor.

6. The display device according to claim 4, wherein, in both of the first and second pixel circuits, a fourth signal line is connected to a gate terminal of the third transistor.

7. The display device according to claim 6, wherein the fourth signal line is common to the first and second pixel circuits.

8. The display device according to claim 1, wherein the first capacitor is a storage capacitor.

9. The display device according to claim 1, wherein the first capacitor is an auxiliary capacitor.

10. The display device according to claim 1, wherein the first capacitor is connected between the first transistor and the driving transistor.

11. The display device according to claim 1, wherein a gate of the second transistor is connected to scanning circuitry.

12. The display device according to claim 11, wherein the scanning circuitry includes writing scanning circuitry, driving scanning circuitry, and signal output circuitry.

13. The display device according to claim 1, wherein, in both of the first and second pixel circuits, a second signal line is connected to a gate terminal of the first transistor.

14. The display device according to claim 13, wherein the second signal line is common to the first and second pixel circuits.

15. The display device according to claim 1, wherein the first signal line of the first pixel circuit is parallel to the first signal line of the second pixel circuit.

16. The display device according to claim 1, wherein the third wiring is a signal wiring and supplies a predetermined voltage.

17. The display device according to claim 1, wherein, in both of the first and second pixel circuits, a third signal line is connected to a gate terminal of the second transistor.

18. The display device according to claim 17, wherein the third signal line is common to the first and second pixel circuits.

19. The display device according to claim 1, wherein the first and second pixel circuits are formed over a silicon substrate.

* * * * *